(12) United States Patent
Kao et al.

(10) Patent No.: US 6,316,326 B1
(45) Date of Patent: Nov. 13, 2001

(54) GAPPED-PLATE CAPACITOR

(75) Inventors: David Y. Kao, Meridian; James Peacher, Boise, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/229,857

(22) Filed: Jan. 13, 1999

Related U.S. Application Data

(62) Division of application No. 09/148,032, filed on Sep. 3, 1998, now Pat. No. 6,018,175.

(51) Int. Cl.$^7$ .................................................. H01L 21/20

(52) U.S. Cl. .................... 438/393; 438/239; 438/250; 438/252; 438/381; 438/395

(58) Field of Search ........................ 438/250, 251, 438/252, 393, 394, 395, 239, 381

(56) References Cited

U.S. PATENT DOCUMENTS

| | | | |
|---|---|---|---|
| 4,055,444 | * 10/1977 | Rao | 438/250 |
| 4,931,901 | 6/1990 | Heron, Jr. | 361/321 |
| 5,013,680 | 5/1991 | Lowrey et al. | 437/52 |
| 5,266,821 | 11/1993 | Chern et al. | 257/312 |
| 5,274,591 | 12/1993 | Waller et al. | 365/189.05 |
| 5,307,309 | 4/1994 | Protigal et al. | 365/63 |
| 5,513,089 | 4/1996 | Sudo et al. | 363/21 |
| 5,554,557 | 9/1996 | Koh | 437/52 |
| 5,557,579 | 9/1996 | Raad et al. | 365/226 |
| 5,581,206 | 12/1996 | Chevallier et al. | 327/143 |
| 5,583,359 | 12/1996 | Ng et al. | 257/306 |
| 5,661,428 | 8/1997 | Li et al. | 323/313 |
| 5,900,663 | 5/1999 | Johnson et al. | 257/343 |
| 6,063,659 | * 5/2000 | Le | 438/250 |
| 6,165,804 | * 12/2000 | Fazan et al. | 438/3 |

FOREIGN PATENT DOCUMENTS

| 59-28368A | 2/1984 | (JP) | H01L/27/04 |
|---|---|---|---|
| 4-88665A | 3/1992 | (JP) | H01L/27/04 |

OTHER PUBLICATIONS

Johnstone, G. G. and J. H. B. Deane. "Calculation of Coupling Gap and Fringing Capacitances in Coupled Rectangulars Bars Between Gound Planes." *Int. J. Electronics*, 1995, vol. 78, No. 4, 729–741.

Halliday, David and Robert Resnick. *Fundamentals of Physics*. New York: Wiley, 1988 Ch. 27–2, 27–3, 619–621.

Riblet, Henry J. "Improved Approximations for the Fringing and Shielded Slab–Line Capacitances." *IEEE Transactions on Microwave Theory and Techniques*, vol. MTT–34, No. 11, Nov. 1986, 1125–1130.

Sakurai, T., and K. Tamaru. "Simple Formulas for Two– and Three–Dimensional Capacitances." *IEEE Transactions on Electrons Devices*, vol. ED–30, No. 2, Feb. 1983, 183–185.

Cloete, J. H. "Coupling Between Two Rectangular Bars Through a Finite Thickness Slot." Conference Proceedings of the 11$^{th}$ European Microwave Conference, 1981, 713–718.

* cited by examiner

*Primary Examiner*—Wael fabmy
*Assistant Examiner*—Toniae M. Thomas
(74) *Attorney, Agent, or Firm*—Charles Brantley

(57) ABSTRACT

In a semiconductor device, a capacitor is provided which has a gap in at least one of its plates. The gap is small enough so that fringe capacitance between the sides of this gap and the opposing plate at least compensates, if not overcompensates, for the missing conductive material that would otherwise fill the gap and add to parallel capacitance. As a result, the capacitance of a storage device can be increased without taking up more die area. Alternatively, the size of a capacitor can be reduced with no decrease in capacitance. Various gap configurations and methods for providing them are also within the scope of the current invention.

27 Claims, 27 Drawing Sheets

GAPPED-PLATE CAPACITOR

RELATED APPLICATION

This application is a divisional of application Ser. No. 09/148,032, filed Sep. 3, 1998 now U.S. Pat. No. 6,018,175.

TECHNICAL FIELD

This invention relates generally to semiconductor devices and, specifically, to charge storage devices and methods for forming the same. Even more specifically, this invention relates to capacitors and a method for forming them as they are used in decoupling devices, charge pumps, delay elements, regulators, and the like.

BACKGROUND OF THE INVENTION

Oftentimes, the formation of capacitors as part of semiconductor circuitry involves (1) forming an oxide layer over a semiconductive substrate, such as a silicon substrate; (2) forming a plate over the oxide; and (3) doping the active area around the plate. The plate/oxide/substrate combination acts as a capacitor, which can serve many uses in semiconductor circuitry. For example, when placed in electrical communication with the connection pads of a die, such a capacitor can be used to filter voltage transients which may be generated by lead frame connection wires that also lead to the connection pads. In such cases, it is beneficial to form a depletion mode capacitor, wherein, between steps (1) and (2), a depletion well is implanted under the plate site with dopants of the same type as the dopants that are to be used in step (3) but at a lesser concentration. As a result, the depletion well is depleted of current carriers (electrons or holes).

As another example, capacitors can be used as part of a charge pump, which provides a current at a potential greater than the potential initially supplied to the circuit. Charge pumps often comprise an oscillator coupled to a capacitor. The capacitor, in turn, is coupled to an output node leading to other circuitry, such as a memory array. As the capacitor receives a signal from the oscillator that rises in voltage, the charge held by the capacitor is pumped to a level above $V_{CC}$ (commnonly referred to as $V_{CCP}$). This charge is subsequently discharged to the output node and used to drive circuitry external to the oscillator.

In a third example, capacitors can be used in delay circuitry, such as RC delay circuits. In such circuits, a resistive element is interposed between an input node and an output node, and one plate of the capacitor is coupled to the output node and to the resistive element, with the other plate coupled to a reference voltage node. The output node's ability to respond to a change in voltage at the input node is delayed by the charging or discharging of the capacitor during that change.

As yet another example, capacitors can be incorporated into various types of regulator circuits such as reference voltage regulators. Examples of such can be found in U.S. Pat. No. 5,513,089 (FIG. 6 and accompanying text) and U.S. Pat. No. 5,581,206.

Regardless of the particular use for a capacitor, there is a constant need in the art to increase capacitance without increasing the die area used by the capacitor. It would also be desirable to maintain or even increase capacitance as the size of capacitors decreases in order to help fit more die on one wafer.

It is noteworthy that, in determining the capacitance of a storage device, prior art often focuses on the capacitance generated between the parallel portions of opposing plates, otherwise known as parallel capacitance. Nevertheless, it is also known that fringe capacitance exists at the sides of the plates and results from the non-uniform electric field at those sides. Further, it is known that this fringe capacitance can play a factor in increasing the total capacitance of a storage device. For example, in U.S. Pat. No. 4,931,901, two plates located side-by-side are added to the existing plates and are used to "fine tune" the total capacitance by allowing relatively small increases in the total capacitance of the storage device. As another example, U.S. Pat. No. 5,583,359, by Ng et al., discloses a capacitor having interleaved plates—wherein the material of one plate extends into a gap within the other plate. The capacitance between the extended portion of the first plate and the laterally adjacent sides of the other plate serves to increase the total capacitance to a point beyond that demonstrated by prior art capacitors with non-interleaved plates.

Another method for increasing capacitance is to create microstructures on the surface area of one of the electrodes, such as by forming hemispherical silicon grain (HSG) thereon. U.S. Pat. No. 5,554,557, by Koh, describes such a method. The bottom electrode consists of a conductive layer with HSG deposited thereon. In the disclosed LPCVD process, grains having a diameter of about 800 angstroms are formed on the conductive layer. (Koh at column 6, lines 45–56.) A dielectric is then conformally layered onto the HSG at a thickness ranging from 40 to 60 angstroms. (Koh at column 6 line 63-column 7 line 7.) Finally, the top electrode is formed over the dielectric. (Koh at column 7, line 8.) However, given the general size of is the grains, the conformal nature of the overlying materials, and the thinness of the dielectric, the top electrode extends into the gap defined by the grains of the bottom electrode. As a result, capacitors using HSG are analogous to the interleaved plates discussed above.

In calculating the capacitance between non-interleaved plates, however, fringe capacitance is often disregarded in the prior art See, for example, DAVID HALLIDAY & ROBERT RESNIK, FUNDAMENTALS OF PHYSICS 620 (1988 3d ed.).

SUMMARY OF THE INVENTION

The current invention provides a gap within a conductive member of a charge storage device, such as a capacitor. Regardless of whether this gap is termed a slot, slit, cavity, bore, trench, nonconformity, discontinuity, or other designation, it is an opening sized in relation to the dimensions of the capacitor's components so that the fringe capacitance between the sides of the gap and the opposing non-interleaved conductive member results in at least as much capacitance per a unit of measurement as results from parallel capacitance. In some embodiments, the gap is in the form of an elongated groove or slot extending through a conductive plate of the capacitor. In one embodiment of this type, the slot is aligned along the width dimension of the plate, whereas another embodiment may have the slot aligned perpendicular to the width. Still another embodiment has an orientation somewhere between the two alignments described above. In other embodiments, there is a plurality of slots within the conductive plate. These embodiments include ones wherein there are slots intersecting each other. Additional embodiments include capacitor plates with gaps having a shape other than slots, such as cylinder-shaped gaps. Included in these types of embodiments are capacitor plates with a single non-slot gap and capacitor plates with multiple non-slot gaps. Combinations of slots and non-slot gaps on one plate are also within the scope of the invention, as are gaps that do not extend completely through the thickness of the plate. Moreover, the current invention also includes methods for forming the embodiments described above.

In distinction from devices having interleaved electrodes, including those devices that interleave on a small scale, such as HSG capacitors, the current invention includes within its scope embodiments wherein one electrode defines an opening that is separate from or does not include, surround, envelop, or intersect with the other electrode. Also covered are embodiments comprising a capacitor electrode having a surface that is generally conformal to the surface of another electrode (to the extent necessary to maintain parallel capacitance) except for at least one nonconformity. Also included are embodiments wherein one capacitor plate is generally continuous for purposes of generating parallel capacitance with a corresponding plate, with the exception of a discontinuity included within the capacitor plate. In one such exemplary embodiment, the face of one capacitor plate is planar and parallel to the face of the corresponding plate (which is also planar) except for a nonparallel portion. In a more specific embodiment, this nonparallel portion is vertically offset from the corresponding plate and, in an even more specific embodiment, is perpendicular to the corresponding plate.

Concerning distinctions from HSG capacitors in particular, the invention's embodiments include those that are generally free of texture or microstructures to the extent that such textures or microstructures are not deliberately created and, if they exist as an inherent result of the creation process, do not substantially contribute to the total capacitance.

DETAILED DESCRIPTION OF THE PREFERRED EMBODIMENTS

Figure 1A:
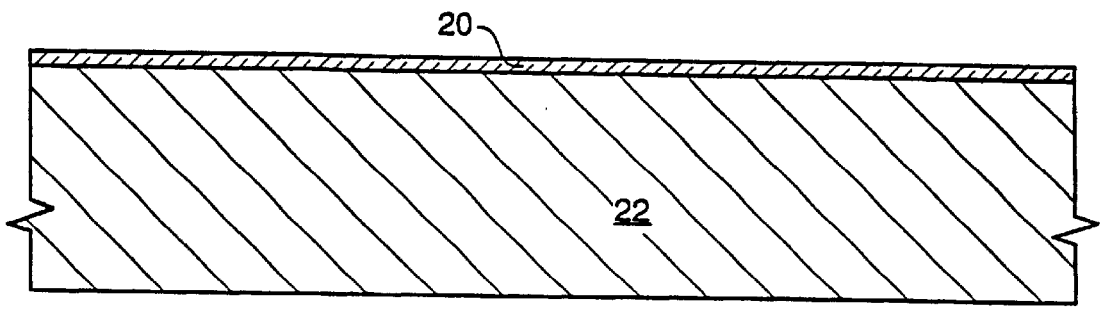
FIGS. 1A through 1H depict the formation of a capacitor as is known in the art

FIGS. 1A through 1H illustrate the general steps known in the art for making a capacitor. As seen in FIG. 1A, an initial layer of oxide 20 is grown over the surface of a substrate 22. In the current application, the term "substrate" or "semiconductor substrate" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). Further, the term "substrate" also refers to any supporting structure including, but not limited to, the semiconductive substrates described above.

Figure 1B:
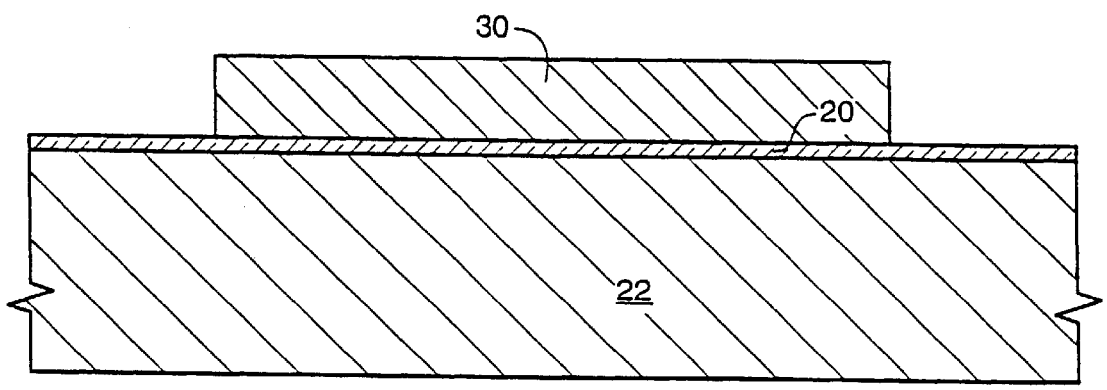
Figure 1C:
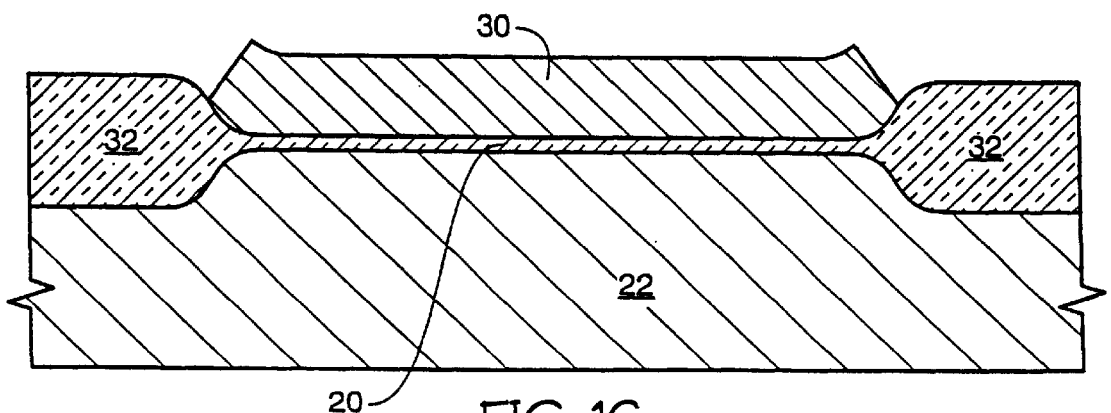
Figure 1D:
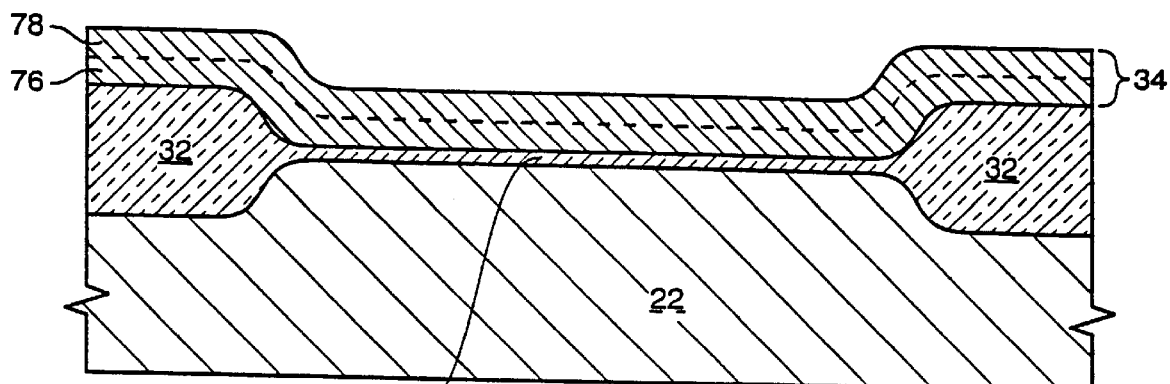

Returning to the process, a first mask 30, depicted in FIG. 1B, is provided through methods known in the art to cover a portion of the oxide 20 and expose the rest. In FIG. 1C, field oxide 32 is then grown from the exposed portions of the oxide 20. In FIG. 1D, the first mask 30 is removed, and a blanket conductive layer 34 is deposited. This conductive layer could be comprised of conductively doped polysilicon, silicide polysilicon (such as tungsten silicide polysilicon), and other conductive materials as well as combinations of conductive materials. For purposes of explaining the current invention, it is assumed that the conductive layer 34 is further comprised of a layer of polysilicon 76 under a layer of tungsten silicide 78. It is further assumed that the polysilicon layer 76 is approximately 0.15 microns thick and the tungsten silicide layer 78 is approximately 0.12 microns thick.

Figure 1E:
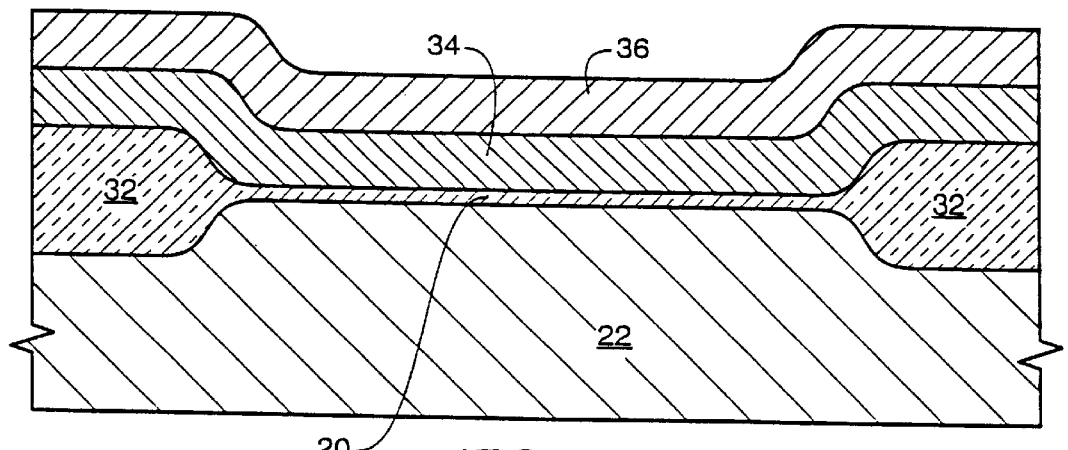
Figure 1F:
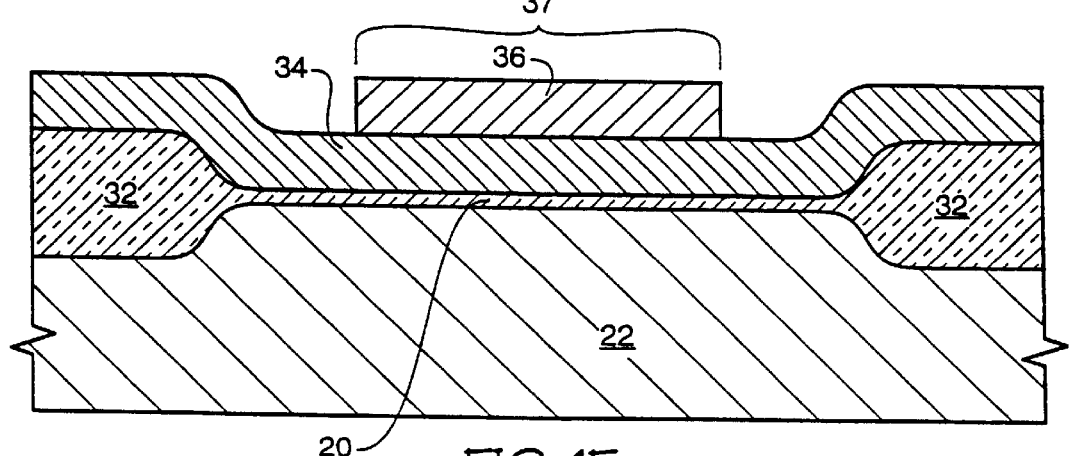
Figure 1G:
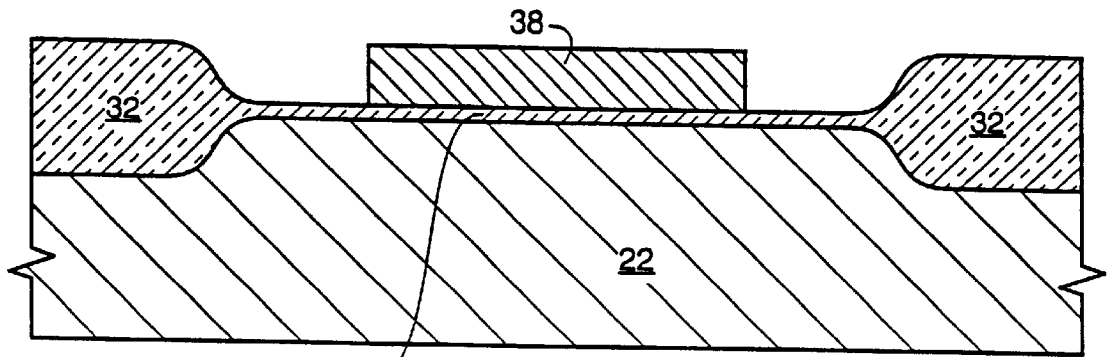

FIG. 1E illustrates that a second mask 36 is subsequently layered. In FIG. 1F, the second mask is patterned, thereby defining a plate site 37 inside the perimeter of which a capacitor plate will be formed. Accordingly, in FIG. 1G, a conductive plate 38 defined by the second mask 36 of the prior step is etched from the conductive layer 34. The second mask 36 is removed after the plate 38 is formed. The conductive plate 38, in turn, defines a boundary of a diffusion region 40 resulting from an implant indicated by a set of arrows 42 in FIG. 1H. The implantation could be used to create a p-type or an n-type diffusion region 40 within the substrate 22. For purposes of demonstration, an n-type diffusion region is assumed in FIG. 1H, resulting from the phosphorous or arsenic implant 42.

Figure 2:
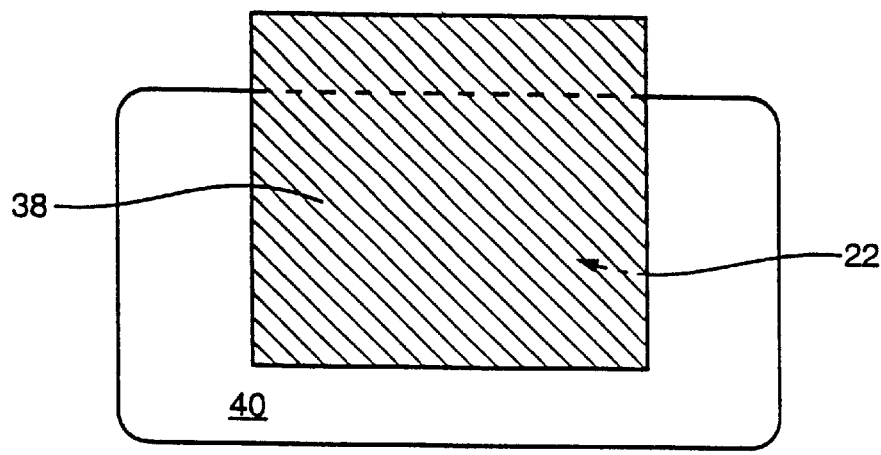
FIG. 2 illustrates a top-down view of a capacitor as known in the prior art.

The steps described above result in a standard capacitor, wherein the substrate 22 and the conductive plate 38 serve as electrodes and the intervening oxide 20 acts as a dielectric. FIG. 2 illustrates a top-down view of the capacitor, wherein the plate 38 overlies a portion of the substrate 22. The n+ diffusion region 40 is part of substrate 22 that lies beyond the coverage of the plate 38. Those skilled in the art can appreciate that the oxide 20 is not labeled in this and other top-down figures for purposes of clarity.

Figure 3:
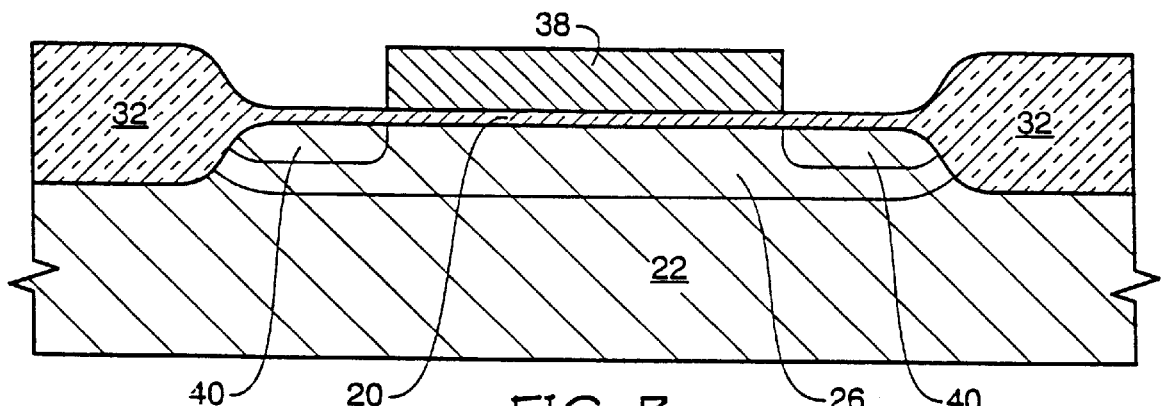
FIG. 3 is a side-view of the cross-section of a depletion-mode capacitor found in the prior art.

It is also possible to form a depletion mode capacitor, shown in FIG. 3, by following the steps in FIGS. 1A through 1H with the addition of a well-implant step interposed between growing the oxide 20 (FIG. 1A) and providing the first mask 30 (FIG. 1B). In a depletion mode capacitor, doping to form the well 26 involves using the same type of implant as that used to create the diffusion region 40. Thus, since n-type dopants were used in FIG. 1H to form diffusion region 40, phosphorous or arsenic is once again used as an implant to create the n-well 26.

Figure 4:
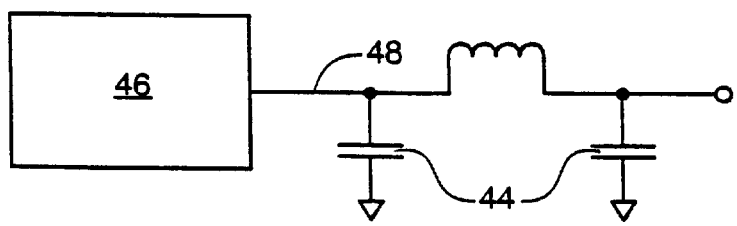
FIG. 4 is a circuit diagram demonstrating a first use of a capacitor as known in the prior art.

Regardless of the type of capacitor developed by these steps, processing continues as dictated in the prior art, including electrically connecting the plate 38 and the diffusion region 40 to different portions of the circuit. These connections are determined by the capacitor's role in a particular circuit. In the schematic of FIG. 4, for example, a pair of capacitors are used as decoupling capacitors 44. As part of an integrated semiconductor device, a die 46 is often electrically connected to external devices through a connection wire 48, which may be made of gold. Because of the length of the wire 48 relative to its width, the wire 48 will function as an inductor. As current through the wire 48 switches on and off, voltage spikes may occur. To reduce the effects of voltage transients, decoupling capacitors 44 are connected as shown. When used in this way, the capacitors 44 provide a low impedance path to ground. The use of capacitors in this fashion is further detailed in U.S. Pat. Nos. 5,266,821 and 5,307,309, among others.

Figure 5:
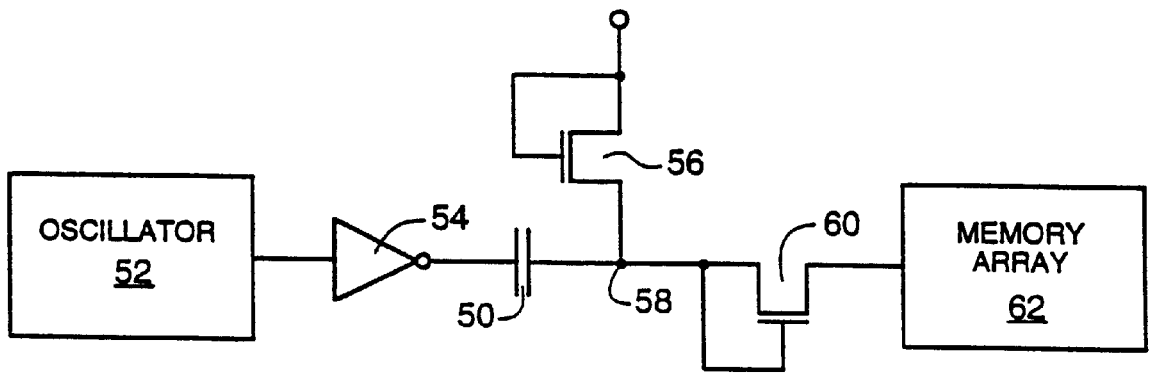
FIG. 5 is a circuit diagram demonstrating a second use of a capacitor as known in the prior art.

A capacitor made by the process described above may also be used in a charge pump, as depicted in FIG. 5. The capacitor 50 receives a signal from an oscillator 52 through an inverter, 54. When the voltage of the signal reaching the capacitor 50 is low, transistor 56 establishes a voltage at node 58 of $V_{CC}$ minus the threshold voltage $V_t$ of transistor 56. As the voltage of the signal reaching the capacitor 50 increases to $V_{CC}$, the charge on the capacitor 50 is pumped to an even higher voltage $V_{CCP}$. As a result, a signal of voltage $V_{CCP}$ is discharged through transistor 60 and ultimately to the access transistors of a memory array 62. The role of capacitors in charge pumps is disclosed further in U.S. Pat. No. 5,661,428.

Figure 6:
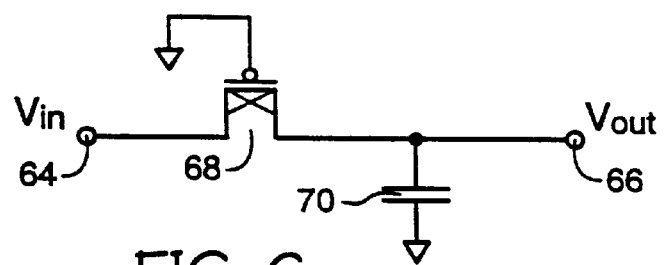
FIG. 6 is a circuit diagram demonstrating a third use of a capacitor as known in the prior art.

As yet another example, a capacitor can be used as part of a delay circuit, a basic version of which is shown in FIG. 6. An input node 64 is configured to receive a signal having a voltage $V_{IN}$ and transmit changes in that voltage to an output node 66 in the form of a signal of voltage $V_{OUT}$. Interposed between these two nodes 64 and 66, however, is a transistor 68, configured to act as a resistive device, and a capacitor 70. As $V_{IN}$ increases, the corresponding increase in $V_{OUT}$ is delayed due to the charging of capacitor 70. Conversely, as $V_{IN}$ decreases, the discharging of capacitor 70 delays the decrease of $V_{OUT}$. Such delay circuits are described in U.S. Pat. Nos. 5,557,579 and 5,274,591.

Figure 7A:
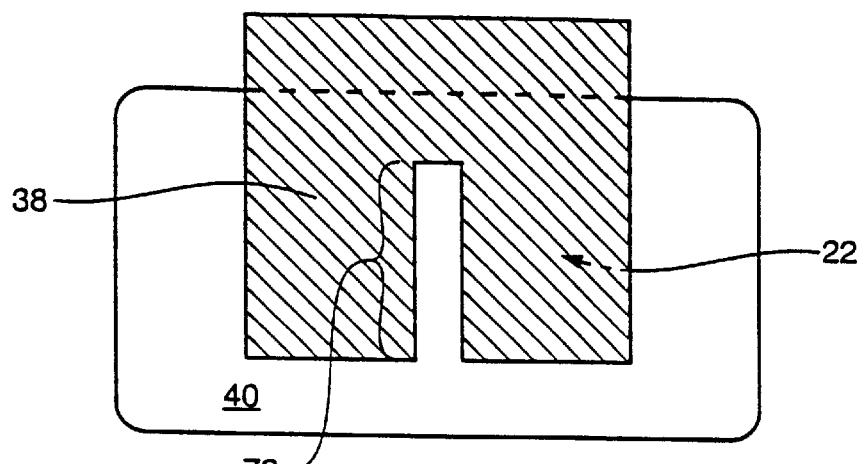
FIG. 7A is a top-down view of a first exemplary apparatus embodiment of the current invention.
Figure 7B:
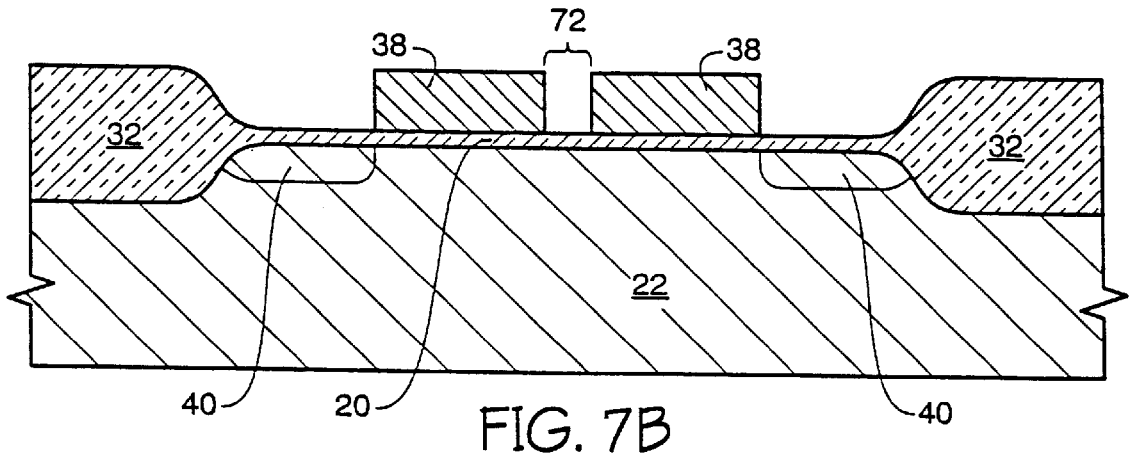
FIG. 7B is a cross-sectional side view of the first exemplary apparatus embodiment of the current invention.
Figure 7C:
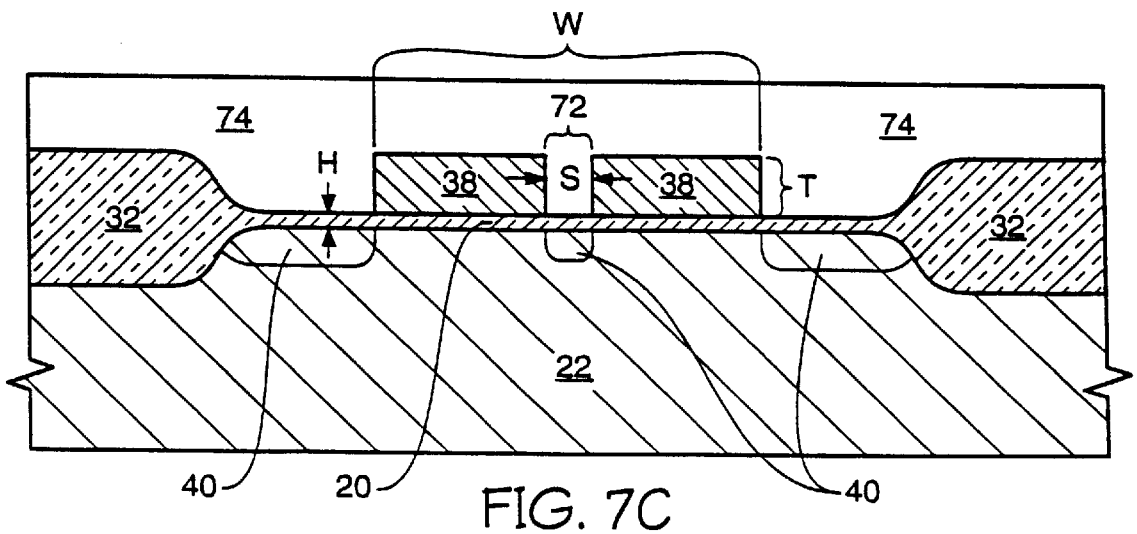
FIG. 7C is a cross-sectional side view of a second exemplary apparatus embodiment of the current invention.

The capacitance of the storage devices used in the examples described above, as well as other devices, can be increased using embodiments of the current invention. Alternatively, embodiments of the current invention could be used to decrease the size of the storage devices while maintaining the capacitance found in larger plates without gaps. One such embodiment appears in FIG. 7A. As in FIG. 2, the top-down view of this exemplary embodiment illustrates a conductive plate 38 over a substrate 22. However, whereas the prior art calls for at least some amount of plate material throughout a defined area or volume, the current invention allows for a gap within that volume having no plate material. FIG. 2, for instance, illustrates a rectangular plate 38. The plate is continuous in that the conductive material making up the plate 38 completely fills the plate site 37 previously defined by the second mask 36 in FIG. 1F. On the other hand, the exemplary embodiment depicted in FIG. 7A allows for a gap through a portion of the plate 38. As a result, the plate in this embodiment does not completely fill the plate site 37 defined in FIG. 1F. Rather, the gap forms a discontinuity within the plate. In this case, the gap is in the form of a slot 72 extending inward from the edge of the plate 38. As seen in a side view in FIG. 7B, the slot 72 in this embodiment also extends from the top of the plate 38 all the way through to the bottom. While the slot 72 does not contain conductive material, it is preferred that the slot be filled with a dielectric material 74 such as silicon dioxide ($SiO_2$), as shown in FIG. 7C. Further, it is preferred, although not required, that the diffusion region 40 extend under the slot 72, also shown in FIG. 7C. It should also be noted that, in FIG. 7C and other figures, the dimensions are not necessarily to scale; rather, they are proportioned to better illustrate the embodiments of the invention. For example, the slot 72 in FIG. 7B or 7C is not necessarily as wide as depicted in relation to the width W of the conductive plate 38.

It is axiomatic that the conductive material making up a capacitor plate plays a substantive part in generating capacitance. Thus, one of ordinary skill in the art would conclude that adding a gap within the plate, thereby reducing the amount of conductive material, would necessarily result in reducing capacitance. This is, in fact, true if the gap is big enough. However, if the gap is small enough relative to other dimensions of the capacitor, the current invention demonstrates that the often neglected factor of fringe capacitance serves to at least compensate for the lack of conductive material.

These assertions are supported by two dimensional simulations performed on the s Atlas Device Simulator, version 3.0.0.R, by Silvaco International. The parameters represented in the simulation are depicted in FIG. 7C, wherein W represents the total width of the conductive plate 38; T represents the thickness of the conductive plate 38; H stands for the height of the dielectric (in this case the oxide 20); and S indicates the slot width. For simulation purposes, it was assumed that H=0.01 microns, W=1 micron, and T=0.27 microns (0.15 microns of polysilicon plus 0.12 microns of tungsten silicide). Initially, S was assumed to be 0 in order to demonstrate the capacitance that would be generated by prior art devices. These parameters are represented by the data illustrated in Table 1 for the Atlas Simulator:

TABLE 1

| #MESH define | | | | |
|---|---|---|---|---|
| mesh | rect | nx=47 | ny=34 smooth=1 | diag.flip |
| x.m | n=1 | l=−2.5 | | |
| x.m | n=9 | l=−0.5 | | |
| x.m | n=14 | l=−0.1 | | |
| x.m | n=24 | l=0 | | |
| x.m | n=34 | l=+0.1 | | |
| x.m | n=39 | l=+0.5 | | |
| x.m | n=47 | l=+2.5 | | |
| y.m | n=1 | l=−2.5 | | |
| y.m | n=12 | l=−0.28 | | |
| y.m | n=27 | l=−0.01 | | |
| y.m | n=30 | l=0 | | |
| y.m | n=32 | l=0.3 | | |
| y.m | n=34 | l=0.5 | | |
| #REGION define | | | | |
| region num=1 | y.min=−2.5 | oxide | | |
| region num=2 | y.min=0 | y.max=0.3 | mat=aluminum | |
| region num=3 | y.min=+0.3 | mat=silicon | | |
| region num=4 | y.min=−0.28 | y.max=−0.01 | x.min=−0.5 x.max=+0.5 | mat=aluminum |
| #ELECTRODE define | | | | |
| elec | num=1 name=M2 | y.min=−0.28 | y.max=−0.01 x.min=−0.5 | x.max=+0.5 |
| elec | num=2 name=M1 | y.min=0 | y.max=0.3 | |
| elec | num=3 name=bulk | substrate | | |
| save | outf=solid.str master | | | |
| #model selection | | | | |
| models print temp=300 srh fermi | | | | |
| #*********** Initial Solution *********** | | | | |
| symb | newton carriers=2 | | | |
| method | xnorm itlimit=30 trap atrap=.5 autonr | | | |
| solve | initial | | | |
| log | outf=solid.log acfile=solid.aclog master | | | |
| solve | v1=0 v2=0 v3=0 vstep=0.5 vfinal=5 elec=2 ac freq=1e5 term=2 | | | |
| end | | | | |

The simulation calculated a capacitance of $4.42241*10^{-15}$ farads/micron, including fringe capacitance from the sides, for a capacitor having a whole plate.

Concerning the syntax for the simulator, the "#" symbol indicates that comments from the programmer will follow. While the simulator program ignores the text in the line after a "#," such comments do allow the programmer to express to others what the following commands will do. For example, "#MESH define" indicates that the following commands will define the two-dimensional grid or mesh in which the capacitor will be simulated. Accordingly, the next line begins that definition. The command "mesh rect" in that line indicates that the simulation will take place in a rectangular mesh. The "nx" and "ny" commands determine how many x and y reference points, or nodes, will be used within the mesh. For example, "nx=47" means that a total of 47 reference nodes will be along the x-axis horizontally bisecting the mesh. The following series of "x.m" (standing for x-mesh) commands determine the spacing of those nodes along the x-axis. Thus, the line "x.m n=1 l=−2.5" sets node 1 at the left-most end of the axis, which ranges in value from −2.5 to 2.5. The next line "x.m n=9 l=−0.5" sets node 9 at the x-axis value of −0.5. As a result, nodes 2 through 8 are assigned to be between the x-axis values of −2.5 and −0.5 Similarly, the "ny=34" portion in the second line establishes 34 nodes along the y-axis, and the "y.m" commands under the series of "x.m" commands determine the pacing of those points along the y-axis.

Returning to the second line, the "smooth=1" portion fixes all region boundaries that will be defined later. The "diag.flip" establishes that all of the diagonals in the mesh will be in the same direction.

After the "y.m" commands, the "#REGION define" comment indicates that various regions of the mesh are about to be defined in terms of the types of material that are to be simulated. The second line in this section establishes that areas having a y value of at least −2.5 will be assumed to be an oxide. Since no maximum y value and no x values are offered, and since −2.5 is actually the absolute minimum y value as defined in the "y.m" commands above, this command establishes that all areas of the mesh that are not further specified will act as an oxide in the simulation. Of course, other regions are specified, including an aluminum region ranging from y=0 to y=0.3, as seen in line 3 of this section. This region is analogous to part of the bottom plate of the capacitor. Next, an underlying layer of silicon is defined to extend from y=0.3 to the maximum value of y (in this case, y=0.5). It should be noted that, concerning y coordinates, higher positive values represent lower points in the mesh. The fifth line of this section sets x and y parameters for an aluminum portion corresponding to the top conductive plate of the capacitor.

Subsequently, the electrodes of the simulated capacitor are defined, as expressed by the "#ELECTRODE define" comment. It is no accident that the first designated electrode has the same x and y parameters as the top conductive plate region defined above. Similarly, the second electrode refers to the bottom plate, and the third region identifies the bulk substrate as the third electrode.

The command line beginning with "save" saves the defined structure to an output file.

The "#model selection" section helps define the environment in which the defined device will be simulated. This is initiated by the "models" command. The "fermi" command at the end of the line establishes parameters for simulated electrons and holes. The "print" parameter will cause the printing of the status of the model as well as a variety of coefficients and constants. The "temp" parameter establishes the simulation temperature in degrees Kelvin.

The final section denoted as "#*****Initial Solution*****" begins by commanding that a symbolic factorization be performed, hence the "symb" command. The "newton" parameter is a particular algorithm that will be used to perform the factorization. Setting "carriers" equal to 2 simulates both holes and electrons as carriers. The line beginning with the "method" command sets the precision of the solution. Next, the "solve" command instructs the simulator to perform a solution for one or more specified bias points. The "initial" parameter sets the voltages for all bias points to zero. The line beginning with "log" dumps the results into a particular file. The following "solve" command establishes initial voltages for each electrode, as well as the ramp up voltages and particular ac/dc parameters. The "end" command speaks for itself.

The next simulations were run using different values for the slot width S. Table 2 contains an example of the pertinent Atlas Simulator data for a 0.02 micron slot:

TABLE 3

| Slot width | Total capacitance |
|---|---|
| 0.2 microns | $3.89 \times 10^{-15}$ farads/micron |
| 0.1 microns | $4.20 \times 10^{-15}$ farads/micron |
| 0.04 microns | $4.43 \times 10^{-15}$ farads/micron |
| 0.02 microns | $4.53 \times 10^{-15}$ farads/micron |

The simulation indicates that, as the slot width S decreases, capacitance actually begins to exceed the capacitance of a storage device without a slot in a plate. Thus, the slot can be configured to generate fringe capacitance that meets or exceeds the parallel capacitance of the capacitor per a unit of width.

This result is further supported by an alternate method of calculating capacitance: on page 183 of volume ED-30, No. 2 of IEEE TRANSACTIONS ON ELECTRON DEVICES (February 1983), T. Sakurai and K. Tamaru propose a formula for calculating capacitance C:

$$C/E_{OX} = 1.15*(W/H) + 2.80*(T/H)^{0.222},$$

TABLE 2

```
#MESH define
mesh    rect      nx=47    ny=34 smooth=1      diag.flip
x.m     n=1       l=-2.5
x.m     n=8       l=-0.5
x.m     n=23      l=-0.01
x.m     n=24      l=0
x.m     n=25      l=+0.01
x.m     n=40      l=+0.5
x.m     n=47      l=+2.5
y.m     n=1       l=-2.5
y.m     n=12      l=-0.28
y.m     n=27      l=-0.01
y.m     n=30      l=0
y.m     n=32      l=0.3
y.m     n=34      l=0.5
#REGION define
region num=1   y.min=-2.5   oxide
region num=2   y.min=0      y.max=0.3     mat=aluminum
region num=3   y.min=+0.3   mat=silicon
region num=4   y.min=-0.28  y.max=-0.01   x.min=-0.5   x.max=-0.01   mat=aluminum
region num=5   y.min=-0.28  y.max=-0.01   x.min=+0.01  x.max=+0.5    mat=aluminum
#ELECTRODE define
elec    num=1    name=M21   y.min=-0.28   y.max=-0.01  x.min=-0.5   x.max=-0.01
elec    num=2    name=M22   y.min=-0.28   y.max=-0.01  x.min=0.01   x.max=0.5
elec    num=3    name=M11   y.min=0       y.max=0.3
elec    num=4    name=bulk  substrate
# save   structure        file
save outf=slot.str         master
#model              selection
models              print     temp=300   srh   fermi
# *********** Initial Solution ***********
symb    newton carriers=2
method             xnorm itlimit=30 trap atrap=.5 autonr
solve   initial
log     outf=slot.log  acfile=slot.aclog master
solve   v1=0 v2=0 v3=0 v4=0 vstep=0.5 vfinal=5 elec=3 ac freq=1e5 term=3
end
```

It should be noted that there are five regions and four electrodes defined in this simulation, as opposed to four regions and three electrodes established by the parameters in Table 1. This is because the slot simulated in these parameters creates an extra region and hence an extra electrode by effectively splitting the top conductive plate into two parts. Based on these entries and other entries corresponding to other slot widths, the Atlas Simulator calculated the capacitance results depicted in Table 3:

wherein $E_{OX}$ is the dielectric constant. For $SiO_2$, $E_{OX}$ is $3.4535 \times 10^{-17}$ farads/micron. Just as discussed above, the variables W, T, and H stand for the width of the conductive plate 38, the thickness of the conductive plate 38, and the height of the dielectric (oxide 20), respectively. Multiplying both sides by $E_{OX}$ yields the solution for the capacitance of a storage device having a whole plate $C_{WHOLE}$:

$$C_{WHOLE} = E_{OX} * [1.15*(W/H) + 2.80*(T/H)^{0.222}].$$

Using the same values as those used in the Atlas Simulator, the capacitance under the Sakurai formula for a storage device having whole conductive plates works out to be $4.1725*10^{-15}$ farads/micron, compared to $4.42241*10^{-15}$ farads/micron determined by the Atlas Simulator. Sakurai claims that the relative error is within 6 percent for 0.3<W/H<30 and 0.3<T/H<30. Nevertheless, even though W/H is 100 in this case, the difference between Sakurai's result and Atlas' result is only 5.64 percent.

Figure 8:
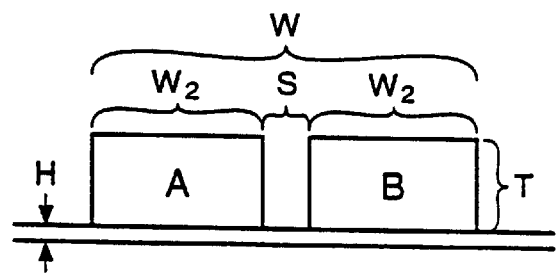
FIG. 8 is a cross-sectional side view of a third exemplary apparatus embodiment of the current invention.

Using Sakurai's formula for a capacitor having a slot in a plate, it is assumed, as shown in FIG. 8, that the slot 72 separates the conductive plate 38 into two portions A and B having an equal width $W_2$. It should be understood that these portions are not completely separated, as the top-down view of FIG. 7A demonstrates that the portions rejoin at another cross-section. Nevertheless, given the side view in FIG. 8, the two-dimensional capacitance for each portion A and B of the conductive plate 38 may be calculated separately. Further, because the two portions have equal widths $W_2$, equal thickness T, and are above the same dielectric height H, the capacitance of portion A ($C_A$) will be the same as the capacitance of portion B ($C_B$).

With the configuration of FIG. 8, the total width W of the conductive plate 38 can be described written as follows:

$$W=W_2+S+W_2$$

or $$W=2W_2+S.$$

Solving for $W_2$ yields:

$$W_2=(W-S)/2.$$

The total capacitance of the storage device depicted in FIG. 8 is the capacitance of portion A plus the capacitance of portion B, or $$C_{TOTAL}=C_A+C_B.$$

Because, $C_A=C_B$, the equation can be simplified to $$C_{TOTAL}=C_A+C_A$$

or $$C_{TOTAL}=2*C_A.$$

Based on Sakurai's equation, the term $C_A$ can be expanded, so that $$C_{TOTAL}=2*E_{OX}[1.15*(W_2/H)+2.80*(T/H)^{0.222}].$$

However, because $W_2=(W-S)/2$, the equation can be rewritten as $$C_{TOTAL}=2*E_{OX}[1.15*(W-S)/(2H)+2.80*(T/H)^{0.222}].$$

Multiplying the "2" factor throughout the equation yields $$C_{TOTAL}=E_{OX}[2*1.15*(W-S)/(2H)+2*2.80*(T/H)^{0.222}].$$

In the first part of the equation, the "2" in the numerator cancels the "2" in the denominator, simplifying the equation to $$C_{TOTAL}=E_{OX}[1.15*(W-S)/H+2*2.80*(T/H)^{0.222}].$$

The first part of the equation can be expanded to $$C_{TOTAL}=E_{OX}[1.15*(W/H)-1.15*(S/H)+2*2.80*(T/H)^{0.222}].$$

The second part of the equation may also be expanded:

$$C_{TOTAL}=E_{OX}[1.15*(W/H)-1.15*(S/H)+2.80*(T/H)^{0.222}+2.80*(T/H)^{0.222}].$$

Rearranging terms within the brackets results in the following:

$$C_{TOTAL}=E_{OX}[1.15*(W/H)+2.80*(T/H)^{0.222}+2.80*(T/H)^{0.222}-1.15*(S/H)]$$

Multiplying $E_{OX}$ throughout the equation yields $$C_{TOTAL}=E_{OX}[1.15*(W/H)+2.80*(T/H)^{0.222}]+E_{OX}[2.80*(T/H)^{0.222}-1.15*(S/H)]$$

It is noteworthy that the first part of this latest equation represents the capacitance of a storage device having a whole plate $C_{WHOLE}$, thus $$C_{TOTAL}=C_{WHOLE}+E_{OX}[2.80*(T/H)^{0.222}-1.15*(S/H)]$$

This equation indicates that, if the second part of the equation $E_{OX}[2.80*(T/H)^{0.222}-1.15*(S/H)]$ is greater than 0, then the capacitance of a storage device with a slot in the conductive plate 38 will exceed the capacitance of a storage device with a whole conductive plate 38. In other words, greater capacitance requires the following equation to be true:

$$E_{OX}[2.80*(T/H)^{0.222}-1.15*(S/H)]>0.$$

Solving for S in this equation will reveal the maximum slot width that will allow greater capacitance. Accordingly, dividing both sides by $E_{OX}$ results in the following equation:

$$2.80*(T/H)^{0.222}-1.15*(S/H)>0.$$

Adding $1.15*(S/H)$ to both sides results in $$2.80*(T/H)^{0.222}>1.15*(S/H).$$

Finally, multiplying both sides of the equation by $H/1.15$ yields $$(H/1.15)*2.80*(T/H)^{0.222}>S,$$

or $$H*2.434*(T/H)^{0.222}>S.$$

Plugging in the given values of H=0.01 microns and T=0.27 microns into this final equation reveals that a slot width S that is less than 0.0506 microns, or 506 angstroms, will increase capacitance.

Figure 9:
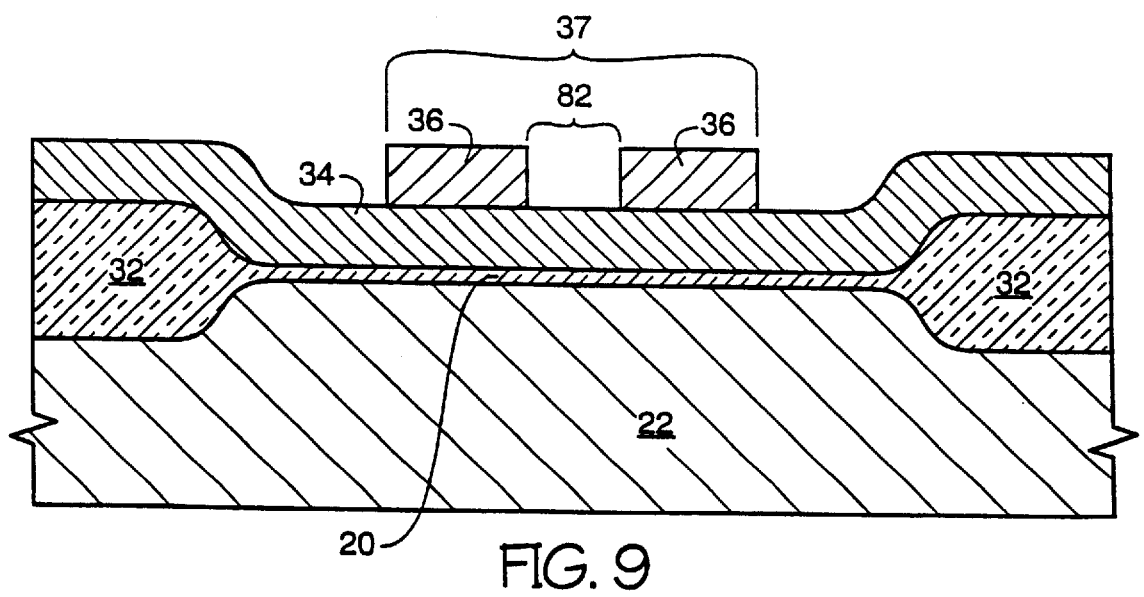
FIG. 9 is a cross-sectional side view representing an in-process device undergoing a first exemplary process within the scope of the current invention.

As for forming a slot-plate capacitor (or a capacitor with any gap within the plate) the steps for doing so in one embodiment initially track the process known in the prior art. The steps illustrated in FIGS. 1A through 1E, for example, would be the same. At that point, however, patterning the second mask 36 can differ, as shown in FIG. 9. In addition to defining the outer boundaries of a plate site 37, the pattern of the second mask 36 also defines a space 82 where the slot will be etched from the conductive layer 34.

Figure 10A:
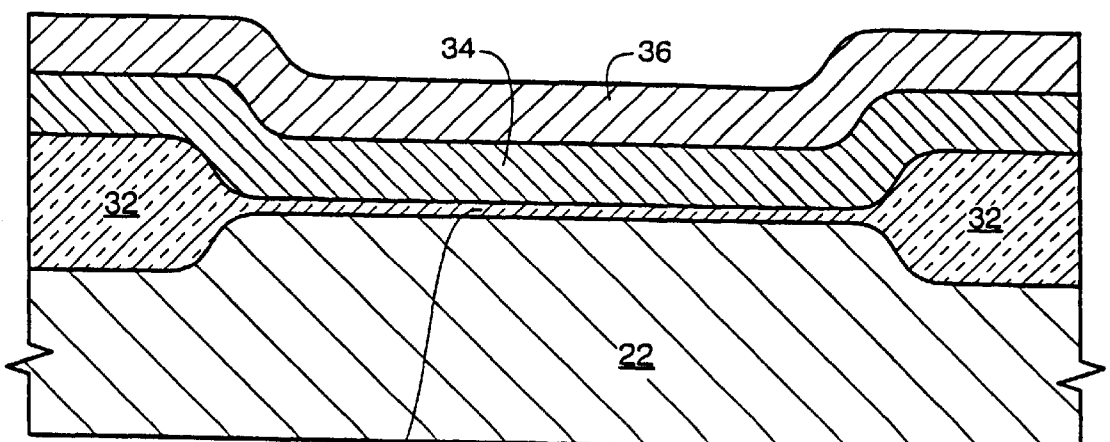
FIGS. 10A through 10I demonstrate a second exemplary process within the scope of the current invention.
Figure 10B:
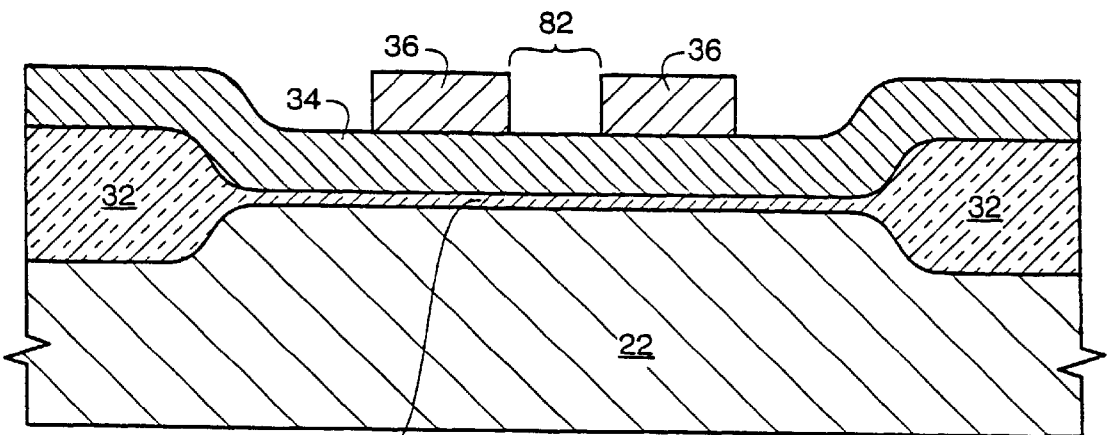
Figure 10C:
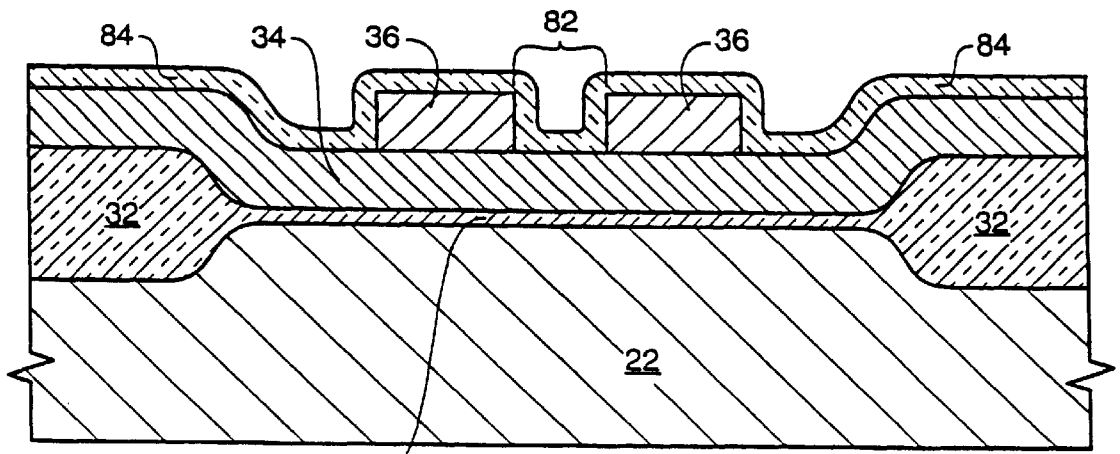
Figure 10D:
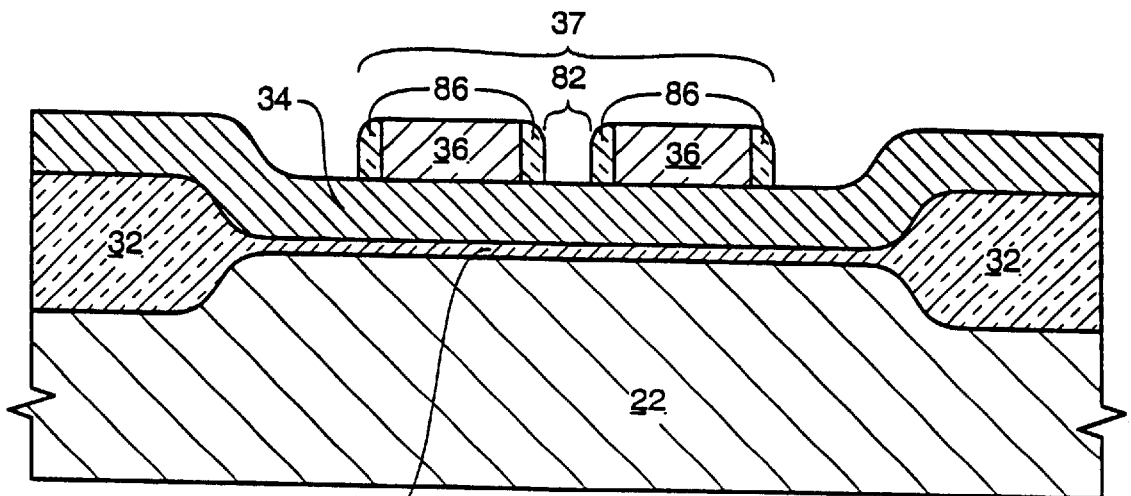

One method for patterning the slot 72 into the conductive layer 34 is illustrated in FIGS. 10A through 10I. FIG. 10A is the same as FIG. 1E, wherein the second mask 36 blanket layer is assumed to be a layer of silicon nitride. It is also assumed for purposes of explanation that it is desired to form a capacitor having a top plate 1 micron, or 10,000 angstroms, wide and a slot through the plate that is 500 angstroms wide. It is further assumed that the minimum dimension achievable for a feature or a space between features is only 0.18 microns, or 1800 angstroms, given a particular lithography technology to be used in this example. Under these assumptions, the process is as follows. As seen in FIG. 10B, the second mask 36 is patterned with a space 82 that is 1800 angstroms wide, leaving 3,450 angstroms worth of mask material on either side. Subsequently, a hard mask material 84, such as one made of silicon dioxide, is conformally deposited over the second mask 36 and the conductive layer 34. This hard mask material is approximately 650 angstroms thick, for reasons that will be come clear below. FIG. 10D shows that the hard mask material 84 is subsequently anisotropically etched to the point where both the conductive layer 34 and the top of the second mask 36 are exposed. As a result, all that is left of the hard mask material 84 are spacers 86 surrounding the second mask 36. Due to the anisotropic etch, the bottom of these spacers 86 is approximately equal to the initial thickness of the conformal layer of hard mask material 84–650 angstroms. Thus, the spacers 86 serve to narrow the space 82 to 500 angstroms (1800 angstroms minus 1300 angstroms covered by the inner spacers 86) as well as extend the total width of the plate site 37 to a full 10,000 angstroms (1300 angstroms covered by the outer spacers 86+the 1300 angstroms covered by the inner spacers 86+3450 angstroms covered by one portion of the second mask 36+3450 angstroms covered by the other portion of the second mask 36+the 500 angstrom space 82). A similar procedure for allowing subcritical dimension features is disclosed in U.S. Pat. No. 5,103,680. Further, given the enabling steps above, it follows that the same space 82 can be created by patterning different widths of second mask 36 portions and a correspondingly different thickness of the hard mask material 84. For instance, second mask portions, each having a width of only 3,400 angstroms, would warrant layering a hard mask material 84 that is 700 angstroms thick. Moreover, it would be possible to resize the portions of the second mask 36 and the thickness of the hard mask material 84 to form a space 82 that is less that than 500 angstroms wide.

Figure 10E:
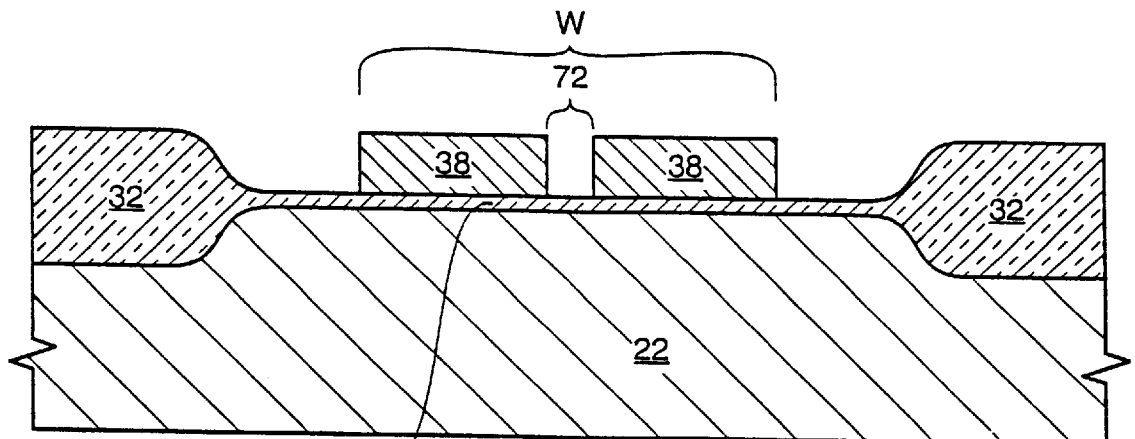
Figure 10F:
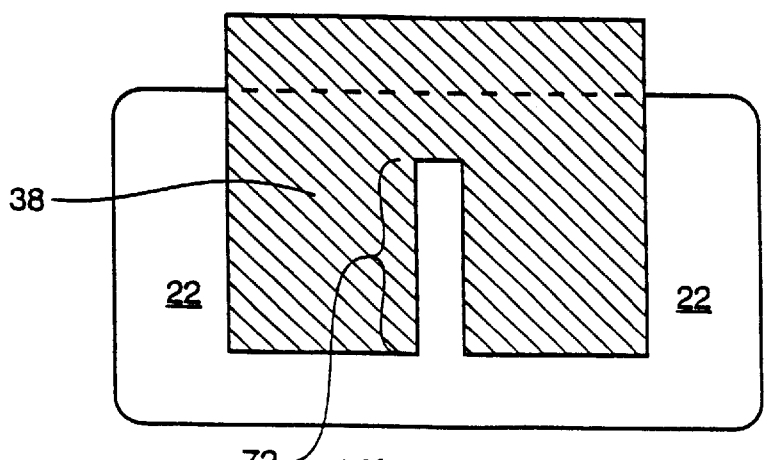
Figure 10G:
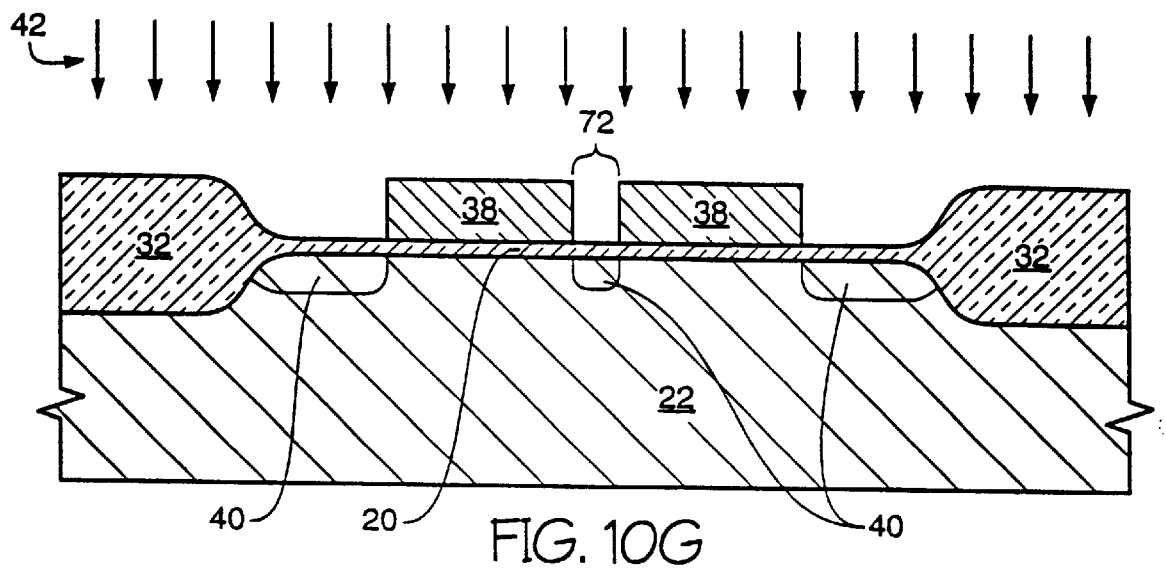
Figure 10H:
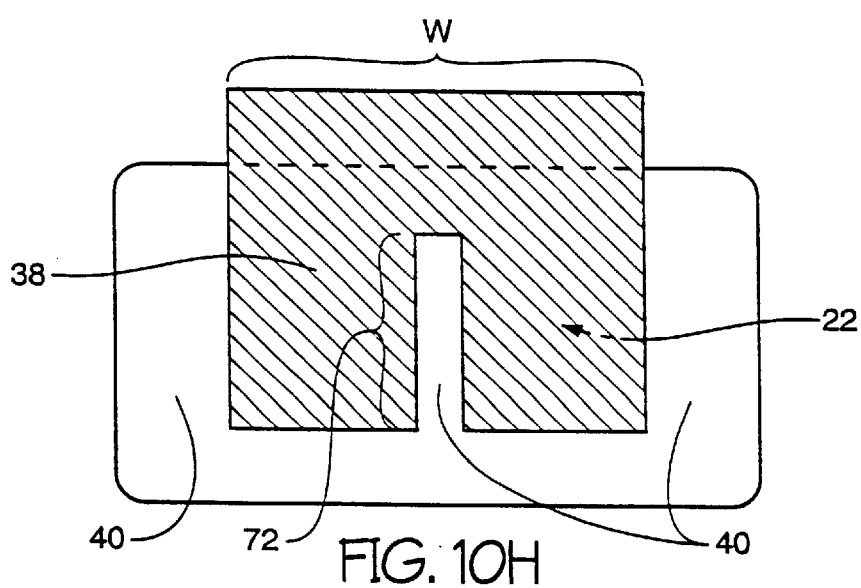
Figure 10I:
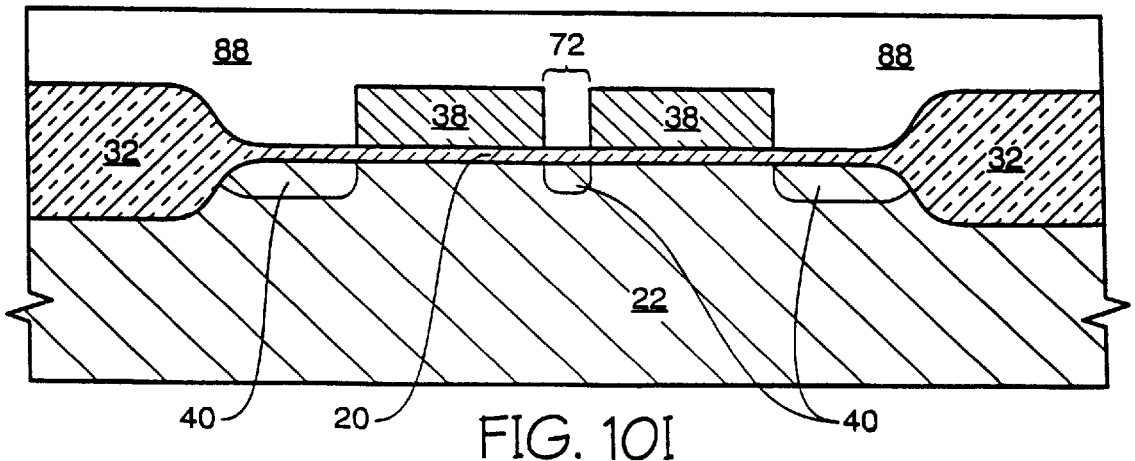

Returning to the process, a selective isotropic etch of the conductive layer 34, using the spacers 86 and the second mask 36 as guides results in the conductive plate seen in FIG. 10E and 10F, having an overall width W of 10,000 angstroms including a slot 72 that is 500 angstroms wide.

The conductive plate 38 with its slot 72 serves to guide the optional implant step, shown in FIG. 10G and once again indicated by arrows 42. This step establishes the diffusion regions 40 external to the conductive plate 38 and coincident with the gap 72, as, shown in FIGS. 10G and 10H. Subsequently, a trench-filling insulative material 88 such as silicon dioxide can be conformally deposited in FIG. 10I. This insulative material 88 not only fills the slot 72 but also covers the entire device and may be subsequently planarized. Further procedures known in the art are also carried out to connect the capacitor in FIG. 10I to other devices.

Figure 11:
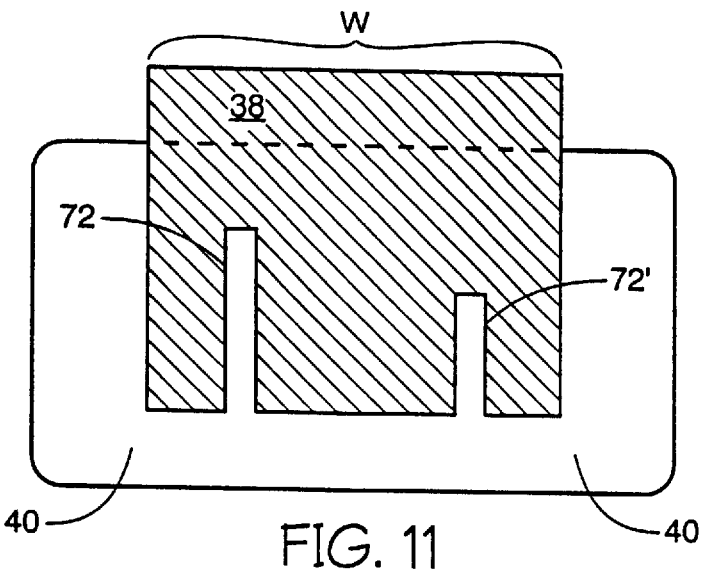
FIG. 11 is a top-down view of a fourth exemplary apparatus embodiment of the current invention.
Figure 12:
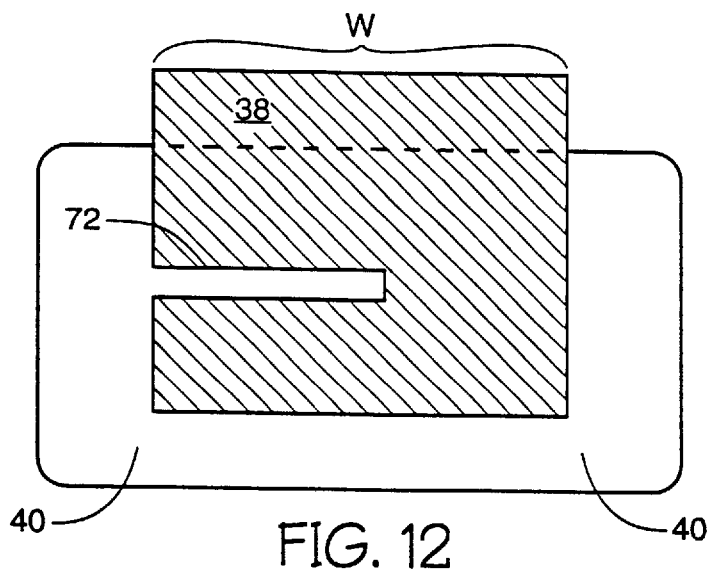
FIG. 12 is a top-down view of a fifth exemplary apparatus embodiment of the current invention.
Figure 13:
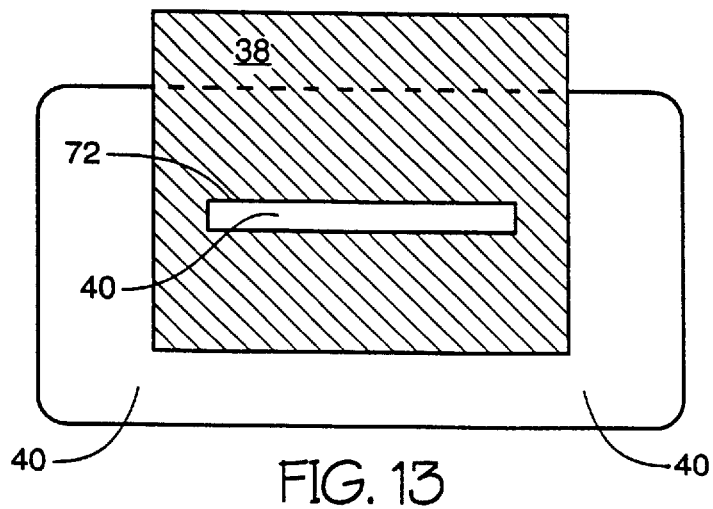
FIG. 13 is a top-down view of a sixth exemplary apparatus embodiment of the current invention.
Figure 14:
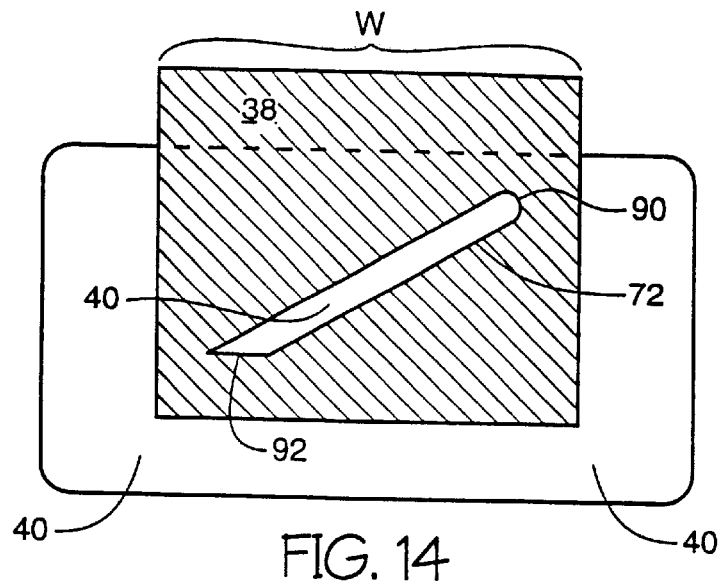
FIG. 14 is a top-down view of a seventh exemplary apparatus embodiment of the current invention.

Charge storage devices with configurations other than the slot-plate enabled above can be realized with the techniques just described. With a different pattern for the second mask 36, multiple slots could be added. FIG. 11, for example, has two slots, 72 and 72', through conductive plate 38. Alternatively, a slot 72 could be added to the conductive plate 38 that is oriented along a particular reference—in this case the width dimension W. Such a configuration can be seen in FIG. 12 and is contrasted from the embodiment in FIG. 10H, which has a slot 72 running transverse to W. Another embodiment, depicted in FIG. 13, illustrates that the slot 72 need not extend to the edge of the conductive plate 38; rather, it can be totally encompassed within the perimeter of the conductive plate 38. FIG. 14 demonstrates that the slot 72 could run diagonally relative to the width dimension W and that the slot 72 could have a rounded end 90 or an angled end 92.

Figure 15A:
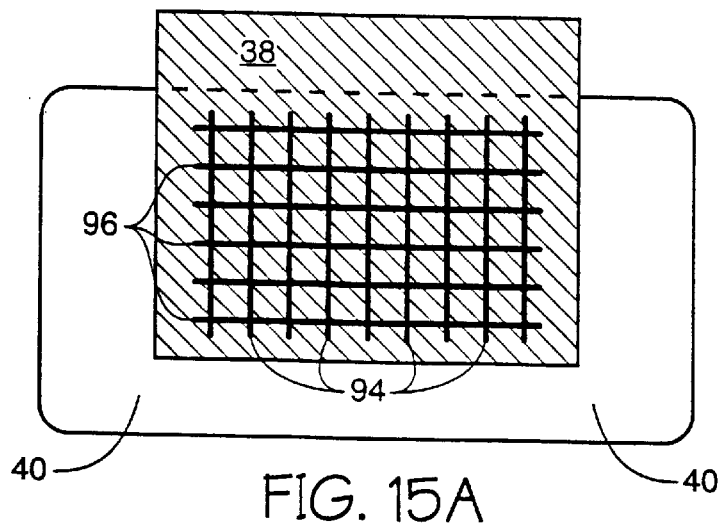
FIGS. 15A and 15B are top-down views of an eighth and ninth exemplary apparatus embodiment of the current invention, respectively.
Figure 15B:
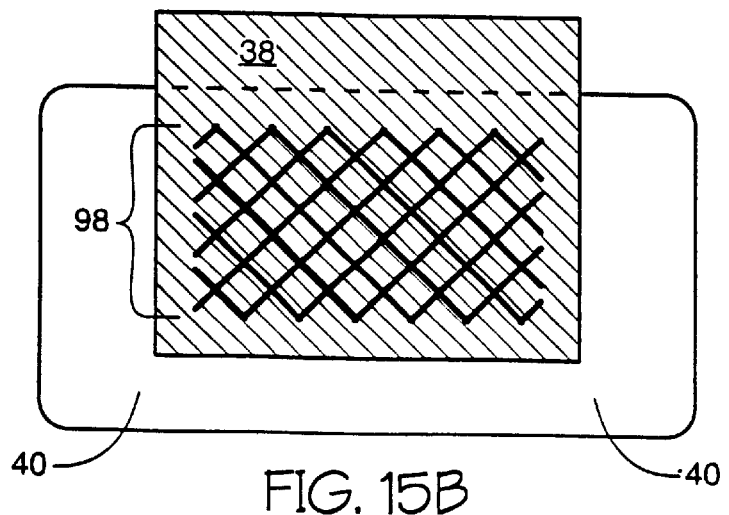

Furthermore, conductive plates having multiple slots are within the scope of the do current invention. FIG. 15A displays a cross-hatched pattern of slots throughout the conductive plate 38, wherein one set of parallel slots 94 are perpendicular to W and a second set of parallel slots are parallel to W. FIG. 15B shows a pattern of diagonally cross-hatched slots 98.

Figure 16:
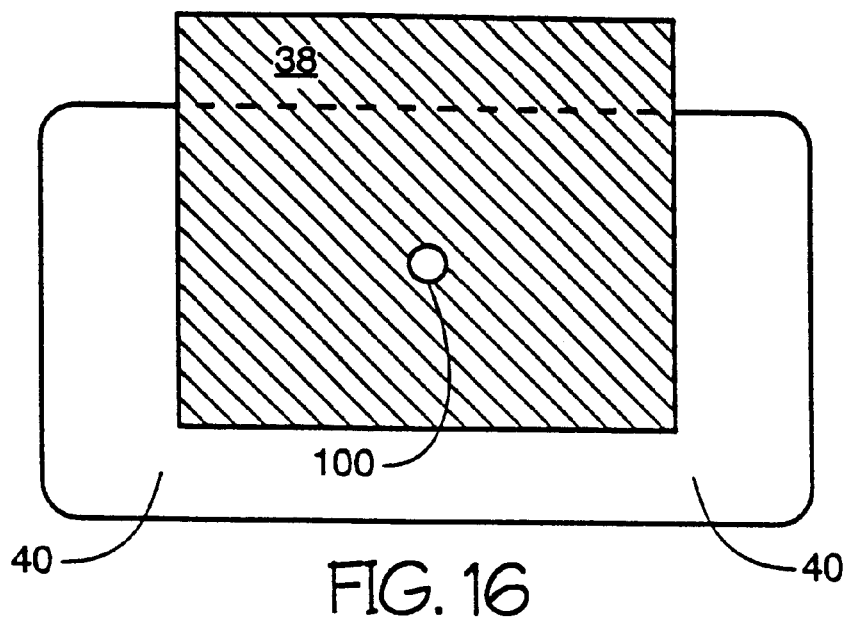
FIG. 16 is a top-down view of a tenth exemplary apparatus embodiment of the current invention.
Figure 17:
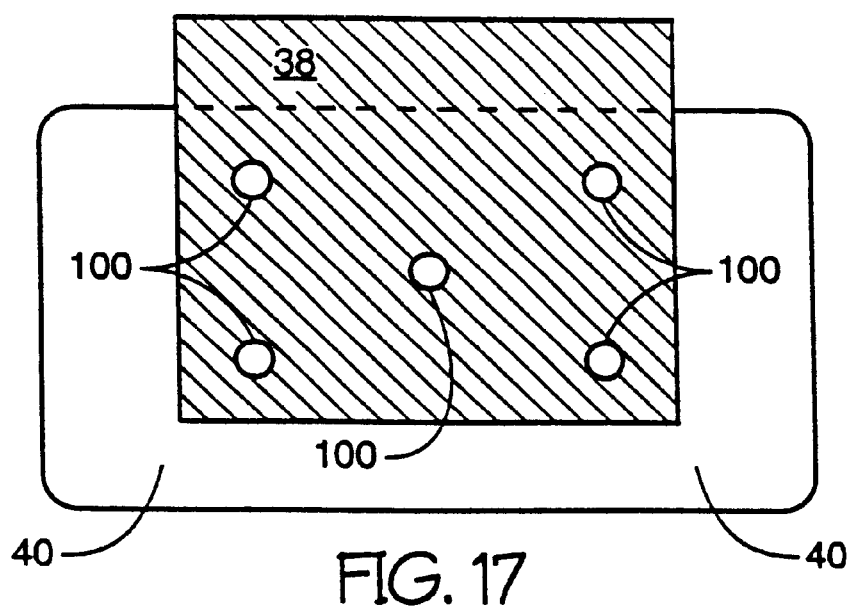
FIG. 17 is a top-down view of a eleventh exemplary apparatus embodiment of the current invention.
Figure 18:
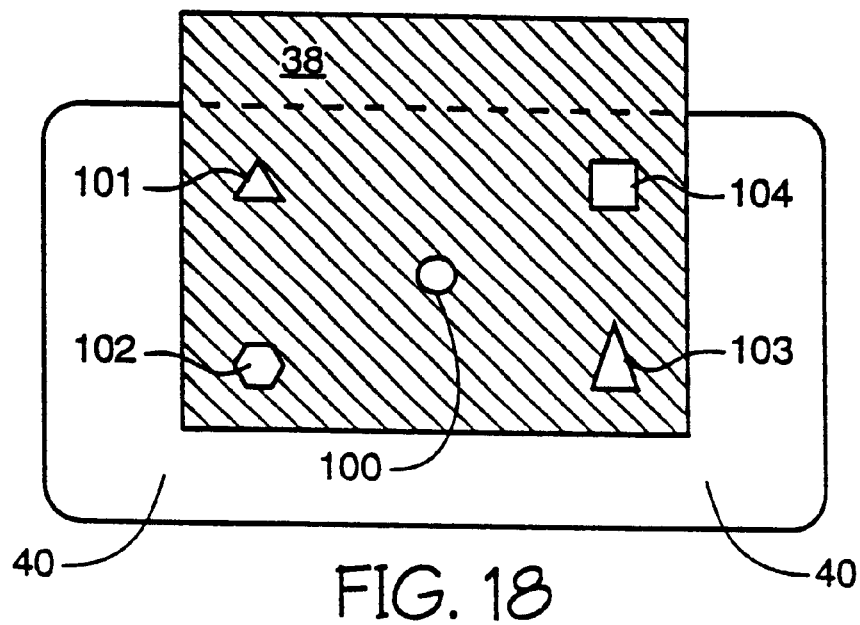
FIG. 18 is a top-down view of a twelfth exemplary apparatus embodiment of the current invention.
Figure 19:
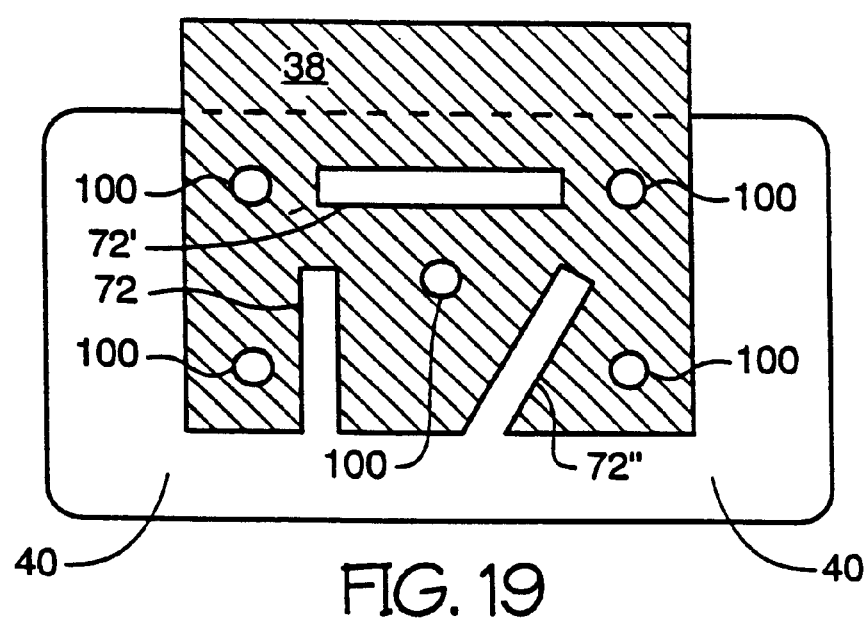
FIG. 19 is a top-down view of a thirteenth exemplary apparatus embodiment of the current invention.

In addition, it is not necessary that the gap in the plate be in the shape of an elongated groove such as a slot. As seen in FIG. 16, for example, a cylindrical opening 100 in the conductive plate 38 could be added. It follows that several openings 100 could be provided throughout the conductive plate 38, as shown in FIG. 17. FIG. 18 shows that there can be openings 100–104 of various shapes. Combinations of different gaps also fall within the scope of the current invention. FIG. 19 demonstrates a conductive plate 38 having a plurality of slots 72, 72', 72", having different orientations, as well as a plurality of openings 100. It should be understood that the gaps of the conductive plate in these and other embodiments should be small enough to allow fringe capacitance to at least match if not overcome the lack of parallel capacitance in those areas.

Figure 20A:
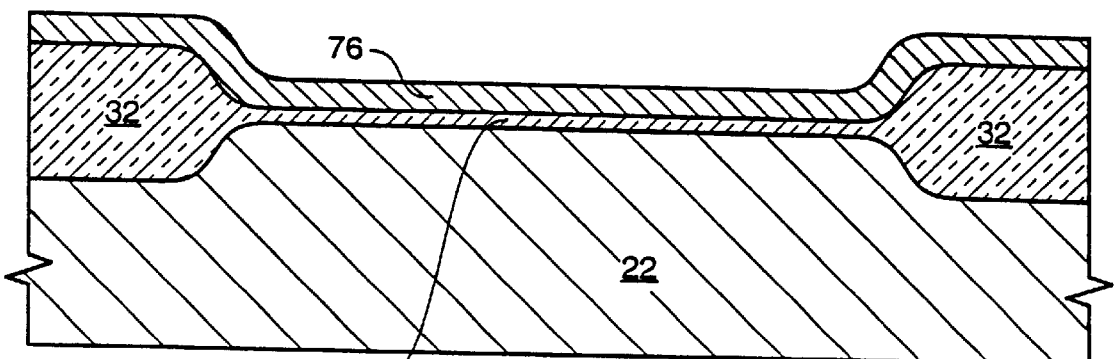
FIGS. 20A through 20F demonstrate a third exemplary process within the scope of the current invention.
Figure 20B:
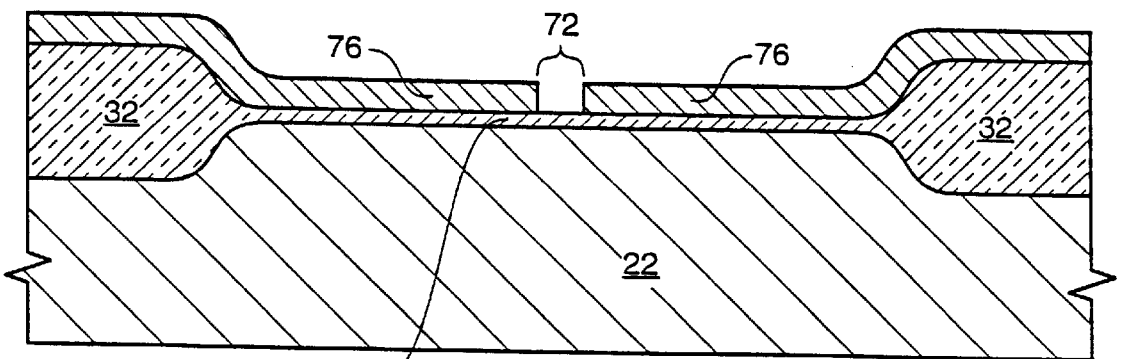
Figure 20C:
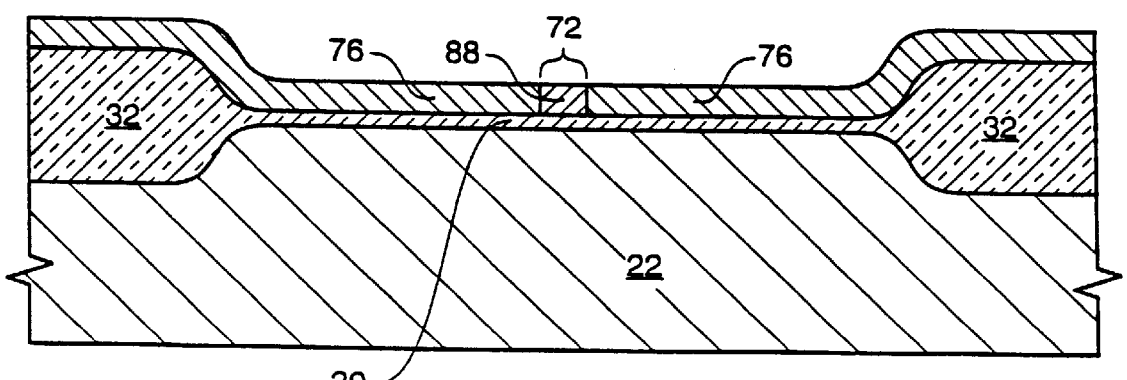
Figure 20D:
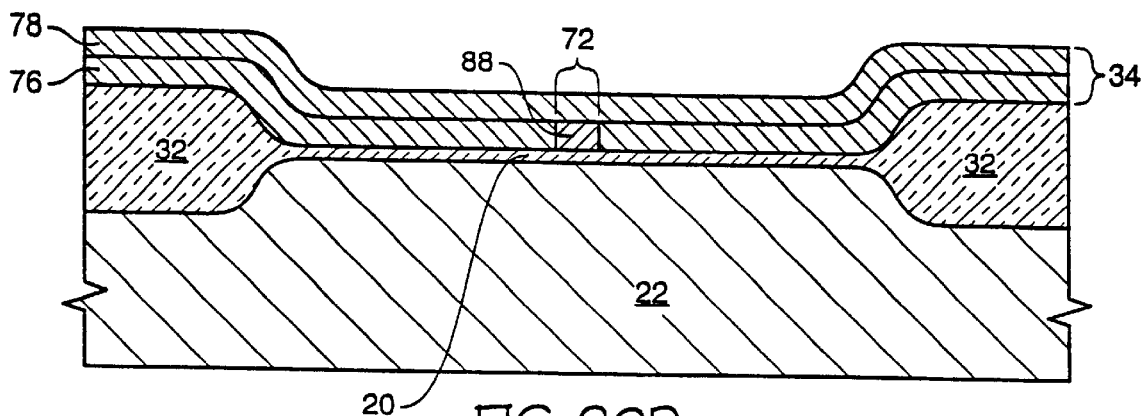
Figure 20E:
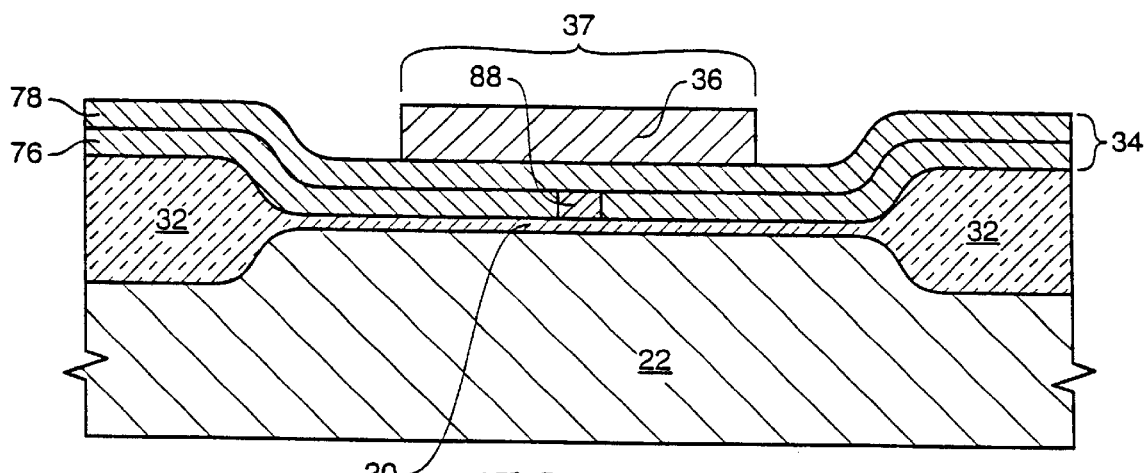
Figure 20F:
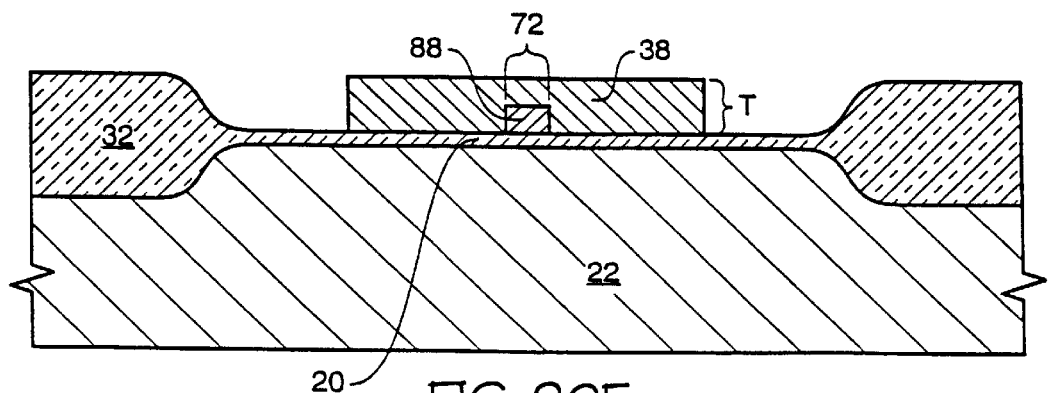

It is also possible to provide gaps that do not span the entire thickness of the conductive plate. Keeping in mind that the conductive layer 34 can comprise two layers—a tungsten silicide layer 78 over a polysilicon layer 67 (seen in FIG. 1D)—the process depicted in FIGS. 20A through 20F may be carried out. After growing the field oxide 32 as depicted in FIG. 1C and removing the first mask 30, the polysilicon layer 76 alone is deposited. Masking steps similar to those disclosed in FIGS. 9 and 10 are used to form the slot 72 through the polysilicon layer 76. FIG. 20C indicates that the trench-filling insulative material 88 is then used to fill the slot 72. In FIG. 20D, the tungsten silicide is then formed over the polysilicon and the insulative material 88 by methods known in the art. The second mask 36, depicted in FIG. 20E, is then used to define the outer boundaries of the plate site 37. The configuration depicted in FIG. 20F results: the conductive plate 38 of the capacitor has a slot 72 that extends only partially through the thickness T of the plate 38. Accordingly, the slot in this embodiment allows for both fringe capacitance as well as parallel capacitance between an area of the plate 38 above the slot 72 and the substrate 22.

Figure 1H:
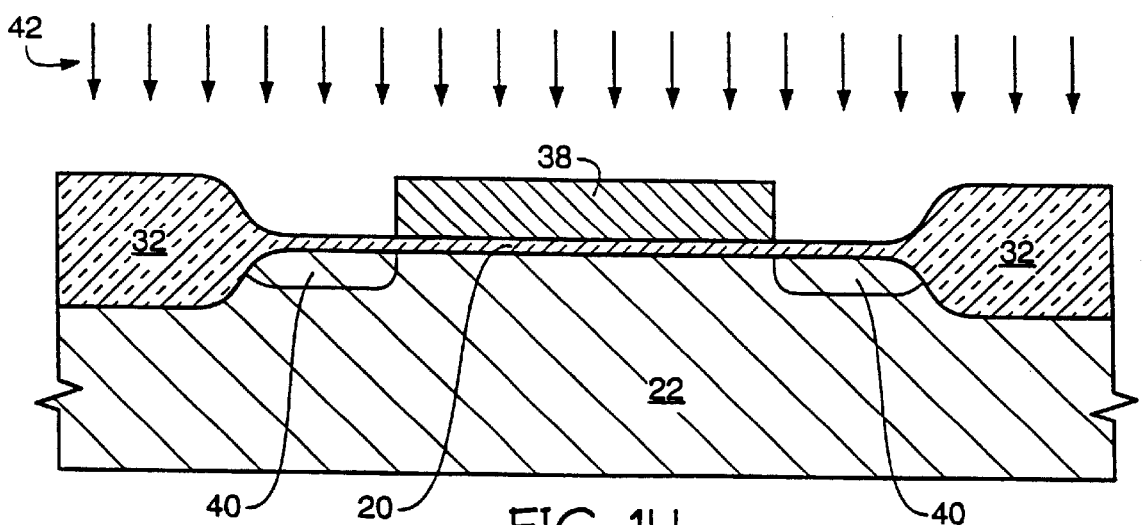
Figure 21:
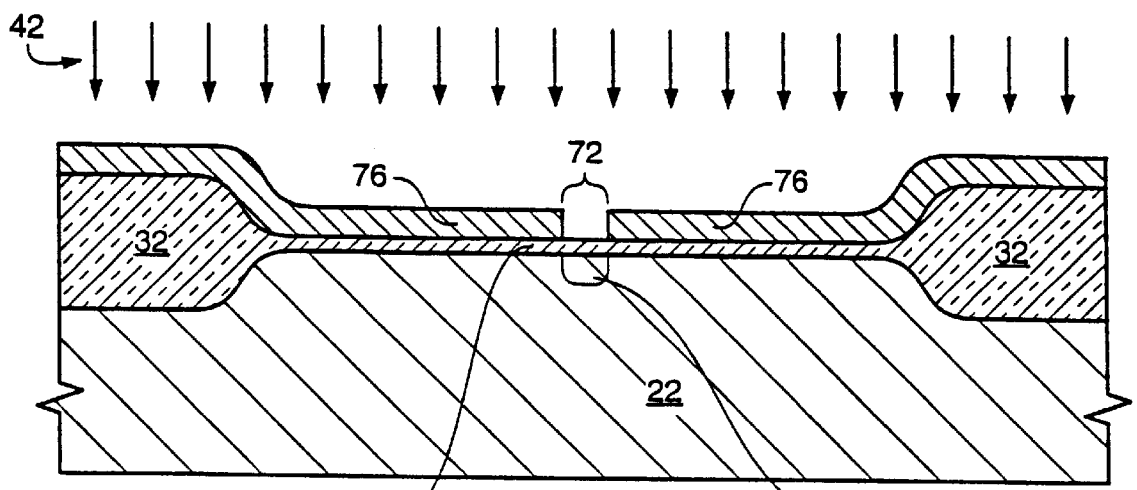
FIG. 21 demonstrates a fourth exemplary process within the scope of the current invention.
Figure 22:
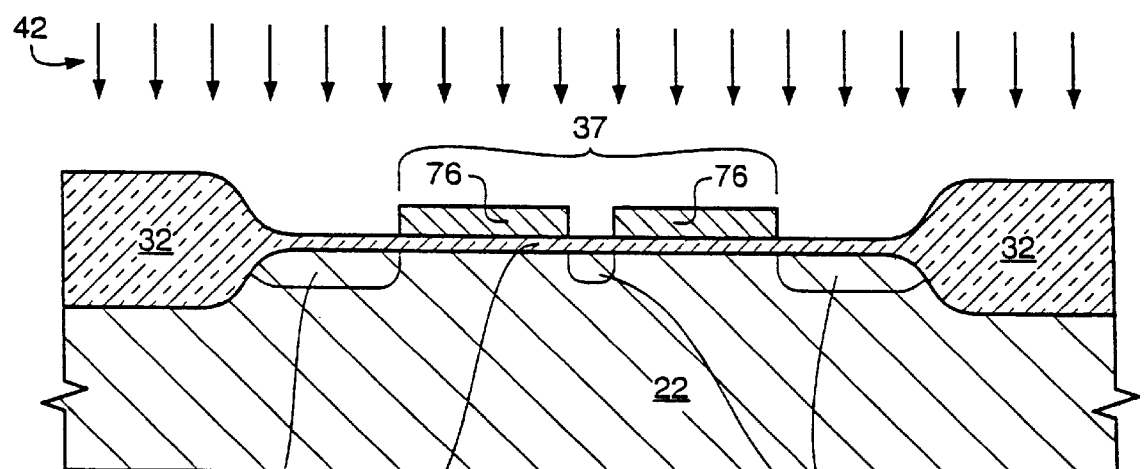
FIG. 22 demonstrates s a fifth exemplary process within the scope of the current invention.

Additional steps may be included in order to provide diffusion areas under the configuration illustrated in FIGS. 20A through 20E. After the step depicted in FIG. 20B, for example, an implant step could be used to create a diffusion region 40. This step is shown in FIG. 21, wherein the implant is once again indicated by a group of arrows 42. The process could then continue as depicted in FIGS. 20C through 20F. Further, a second implant step could be performed once the conductive plate is completed in order to create diffusion regions 40 between the plate 38 and the field oxide 32, as seen in FIG. 1H. Alternatively, the polysilicon layer 76 could be patterned to define the outer boundary of the plate site 37, as shown in FIG. 22. This would allow one implantation step 42 to form all of the desired diffusion regions 40.

Figure 23:
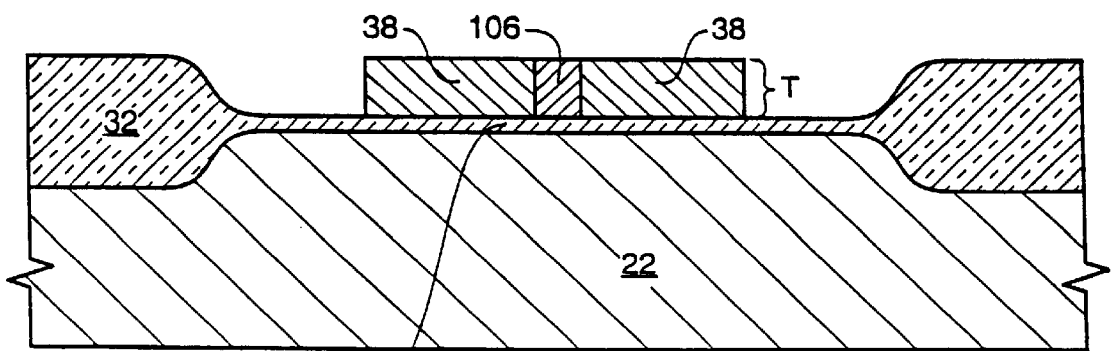
FIG. 23 demonstrates a sixth exemplary process within the scope of the current invention.

One skilled in the art can appreciate that, although specific embodiments of this invention have been described above for purposes of illustration, various modifications may be made without departing from the spirit and scope of the invention. For example, gaps that do not span the entire thickness of the conductive plate could be used in patterns similar to those depicted in FIGS. 11 through 19. In addition, other processes could be used to form gaps in the conductive plate. For instance, X-ray lithography could be used to add a space 82 in the second mask layer 36, as depicted in FIG. 9. This would eliminate the need for using spacers to supplement other lithography processes that could not provide sufficient resolution. As another option, a laser beam could be used to oxidize a portion of the conductive plate. Thus, for example, after the step depicted in FIG. 1G, a laser may be used to form an oxidized region 106 throughout the thickness T of the conductive plate 38. The result of this step is shown in FIG. 23.

Figure 24A:
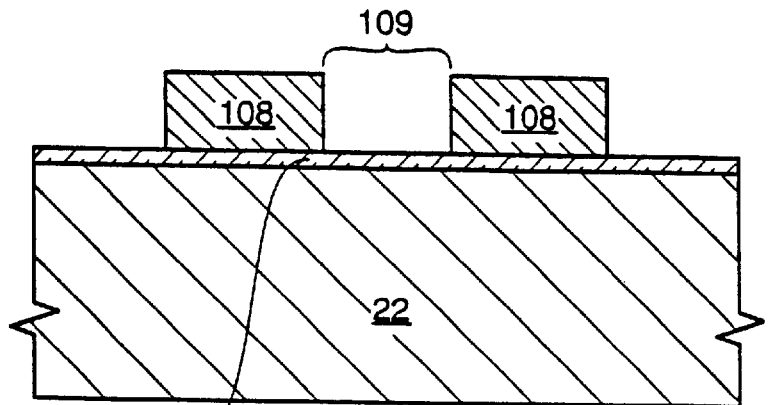
FIGS. 24A through 24F illustrate additional exemplary embodiments of the current invention.
Figure 24B:
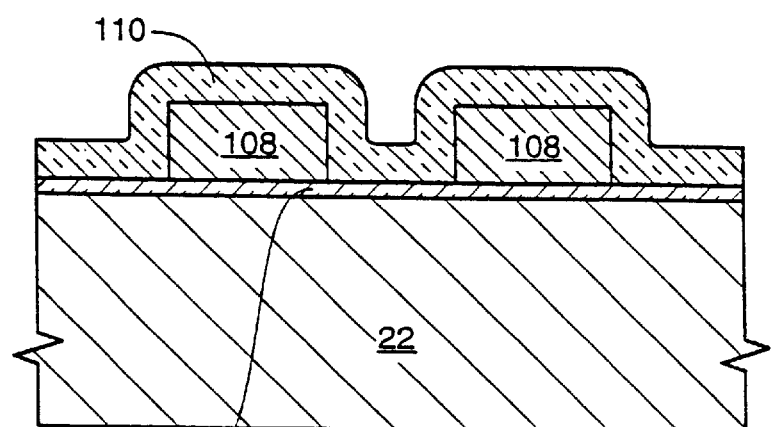
Figure 24C:
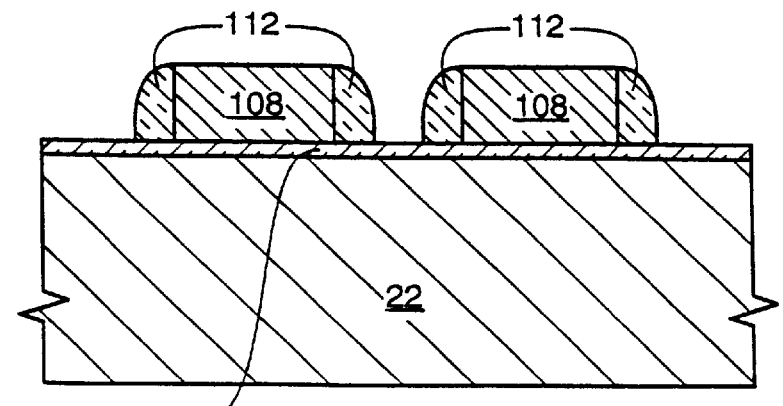
Figure 24D:
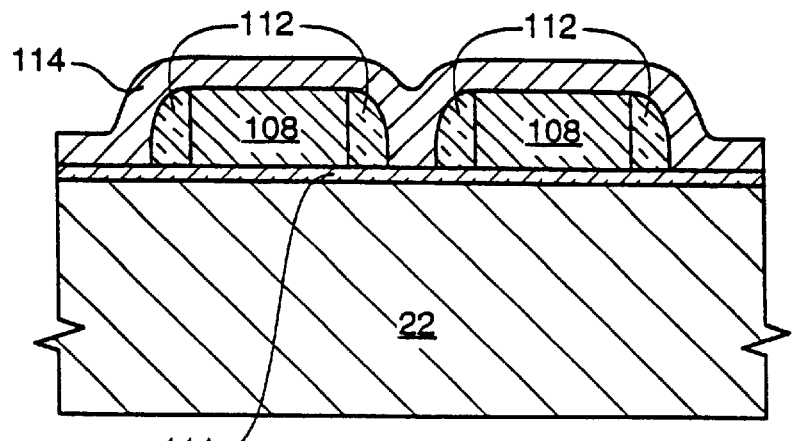
Figure 24E:
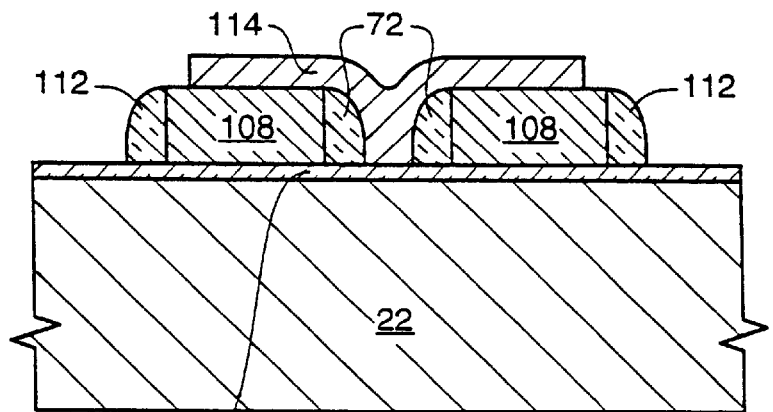
Figure 24F:
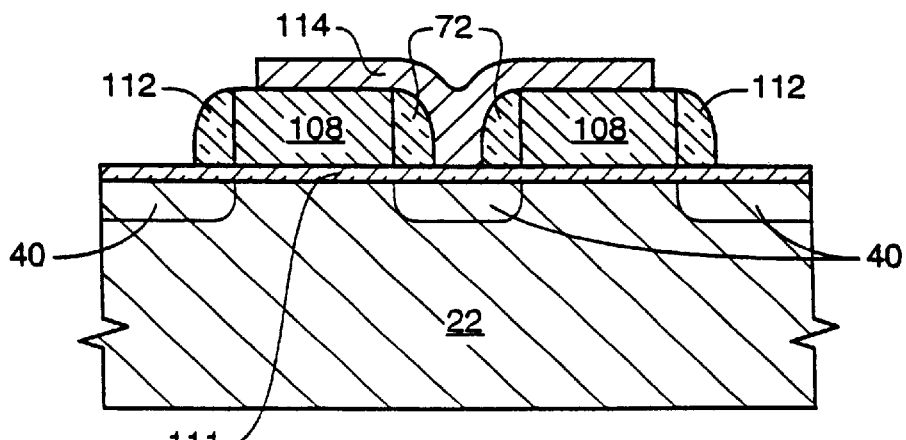

Nevertheless, if it is desired to use some form of spacer (in order to create sub-critical dimension features using lithography, for example), there are options other than the ones disclosed above that also fall within the scope of the current invention. One such option is disclosed in FIGS. 24A through 24F. FIG. 24A discloses a first conductive layer 108 (which may comprise polycrystalline silicon) that lies over a dielectric layer 111, such as some sort of oxide. As in previous embodiments, the dielectric layer 111 overlies the substrate 22. Further, a recess 109 has been etched from the first polysilicon layer 108. Again, as seen with the slot 72 in previous embodiments, this recess 109 does not completely separate that layer 108 into separate portions. See, for example, FIG. 7A. It merely appears that way in FIG. 24A due to the particular cross-section chosen. FIG. 24B illustrates that an insulator 110, such as SiO$_2$, is subsequently layered, and FIG. 24C indicates that the insulator 110 is then anisotropically etched to form insulating spacers 112. Next, a second conductive layer 114 pictured in 24D (which may also comprise polysilicon) is provided. Known patterning and etching steps may then be taken to remove portions of the second conductive layer 114, resulting in the embodiment illustrated in FIG. 24E. In this embodiment, the slots 72 found in prior embodiments appear in the form of the dielectric spacer between the two conductive layers 108, 114. As in previously discussed embodiments, the total width of the slot 72 should be small enough to at least compensate for the absence of conductive material. In this embodiment, the total width of slots 72 is preferably 300 to 500 angstroms. Furthermore, if desired, an implant step may be performed at some point during the process, such as after the step in FIG. 24A, to provide diffusion regions 40, as seen in FIG. 24F.

Figure 25A:
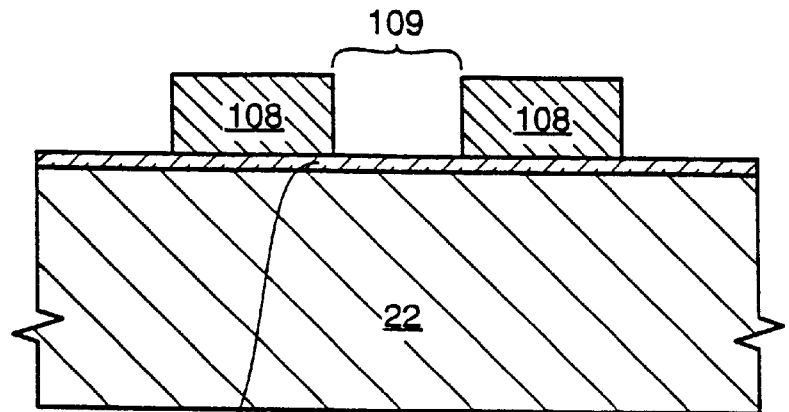
FIGS. 25A through 25F depict more exemplary embodiments of the current invention.
Figure 25B:
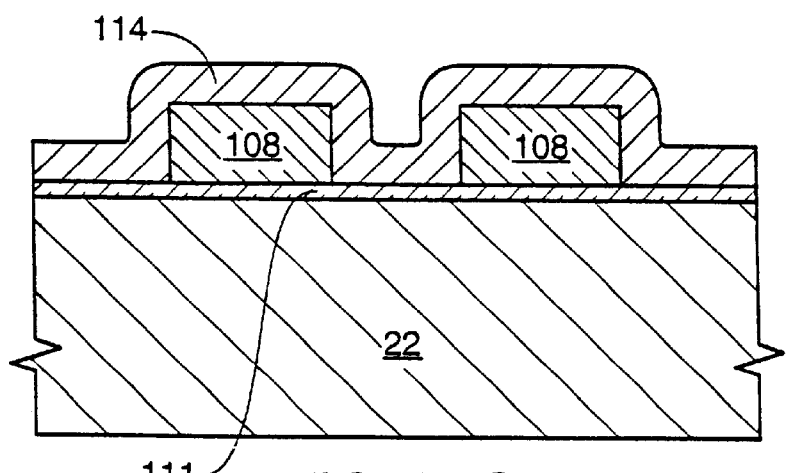
Figure 25C:
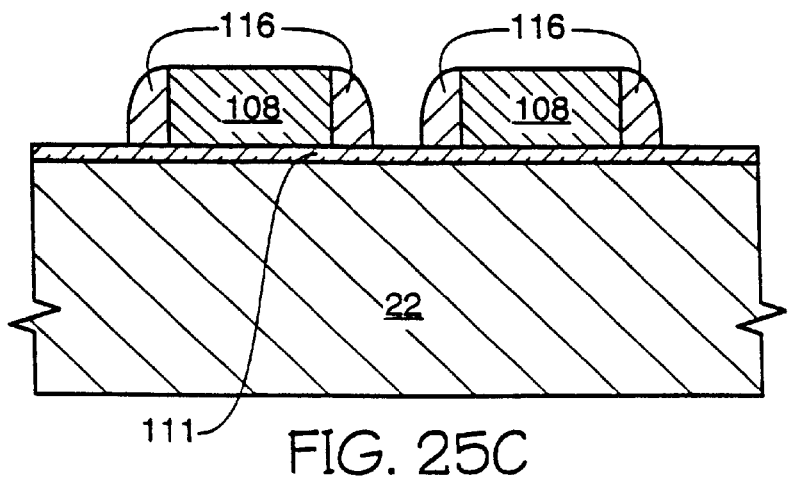
Figure 25D:
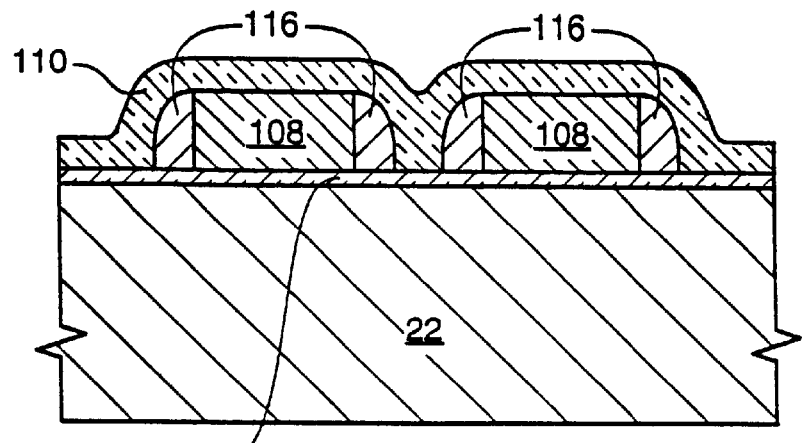
Figure 25E:
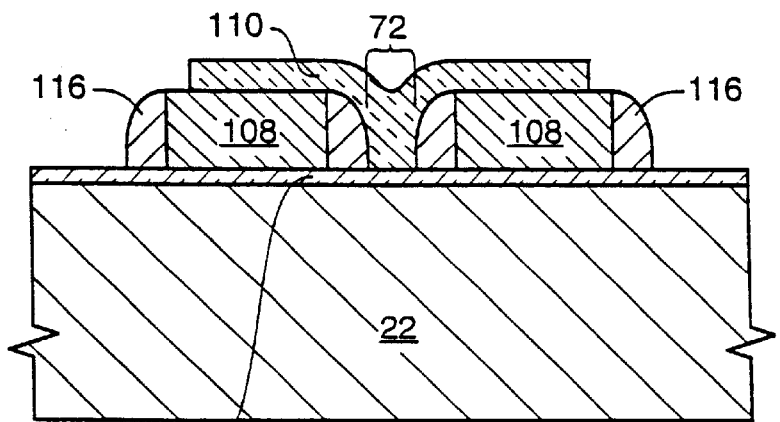
Figure 25F:
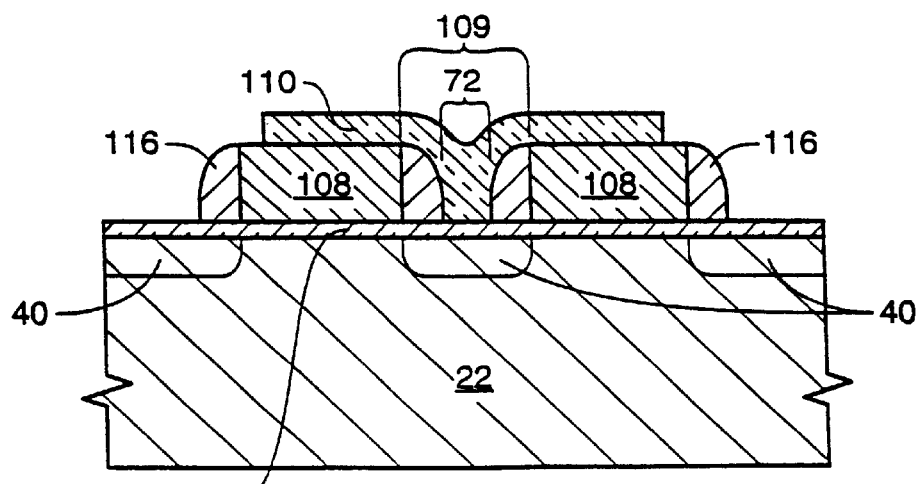

A second option using spacers is demonstrated in FIGS. 25A through 25F. Rather than provide an insulating spacer, this embodiment teaches using a conductive spacer. As seen in FIG. 25A, the process begins in a manner similar to the process step shown in FIG. 24A. Specifically, FIG. 25A shows the first conductive layer 108 defining a recess 109. FIG. 25B, however, indicates that the next step is to provide the second conductive layer 114 over the patterned first conductive layer 108. An anisotropic etch of the second conductive layer 114 forms the conductive spacers 116 depicted in FIG. 25C. Only then is the insulator 110 layered (FIG. 25D) and patterned and etched (FIG. 25E). In this embodiment, the slot 72 comprises the space between elements 108 and 116. Also in this embodiment, it can be seen that the width of slot 72 is generally the width of the recess 109 minus twice the thickness of one spacer portion 116. One skilled in the art can also appreciate that the width of the slot 72 varies in any particular embodiment of this type given the curvature of the spacers 116. Assuming a recess 109 of 0.18 microns, it is preferred in this embodiment that the spacer 116 be 0.08 microns at its thickest point, thereby providing a slot generally 0.02 microns wide (wherein slot width=recess width−(2×spacer thickness)). As in the previous embodiment, an implant step may be performed at some point in order to create diffusion regions 40 illustrated in FIG. 25F.

Figure 26A:
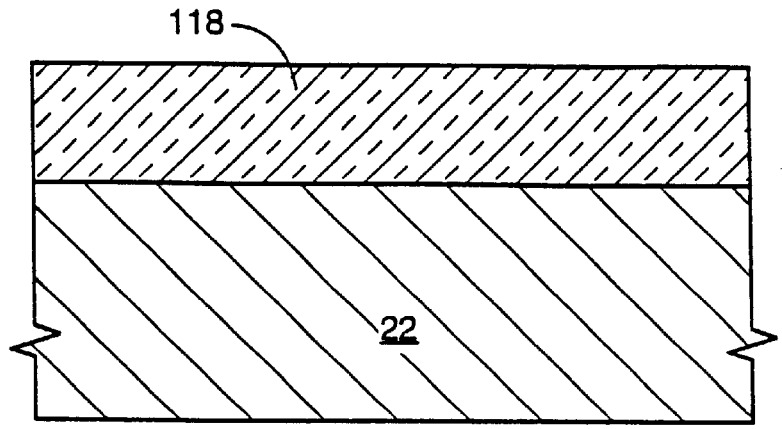
FIGS. 26A through 26G show still more exemplary embodiments of the current invention.
Figure 26B:
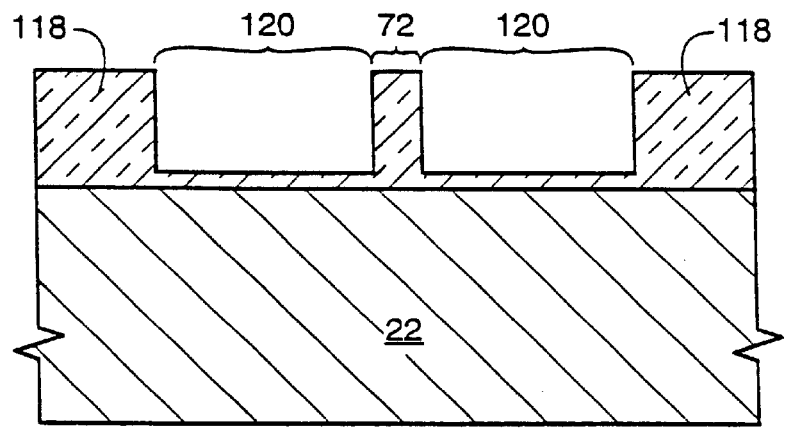
Figure 26C:
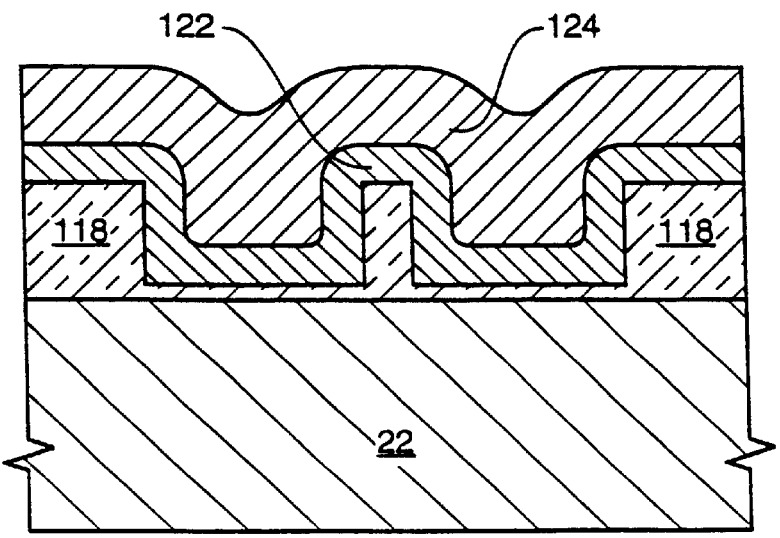
Figure 26D:
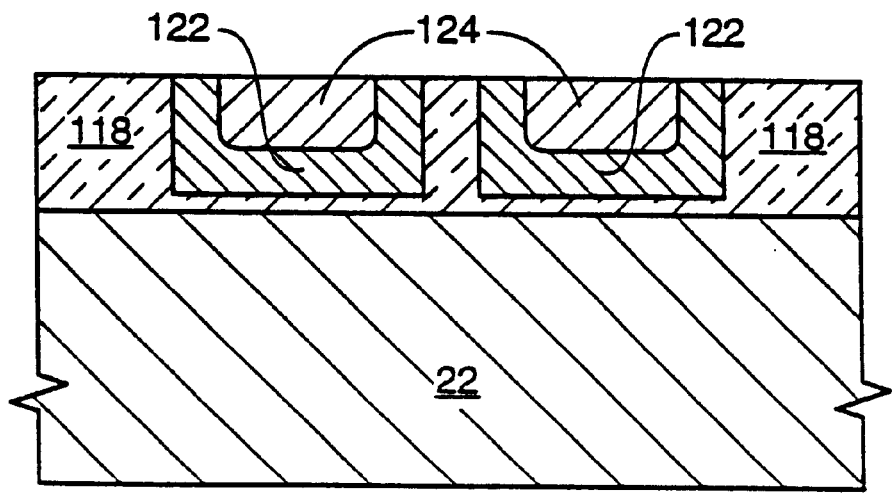
Figure 26E:
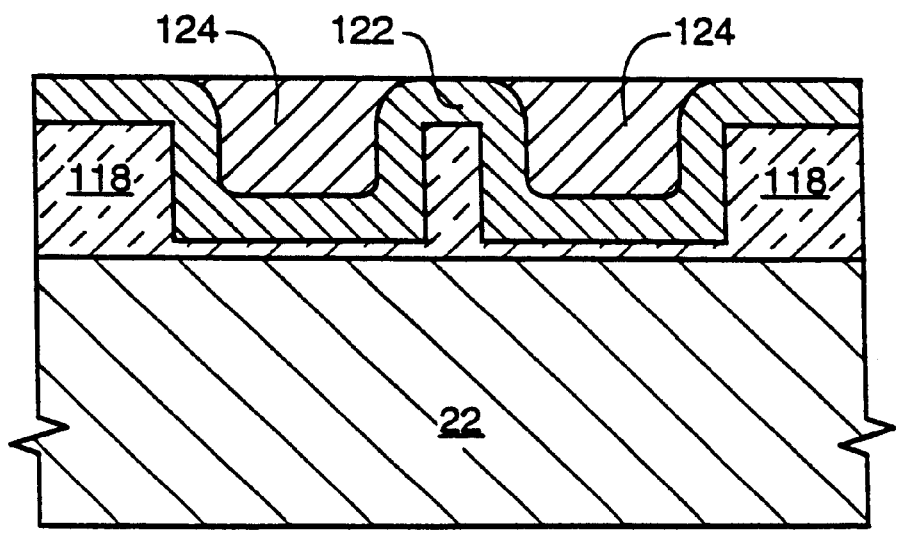
Figure 26F:
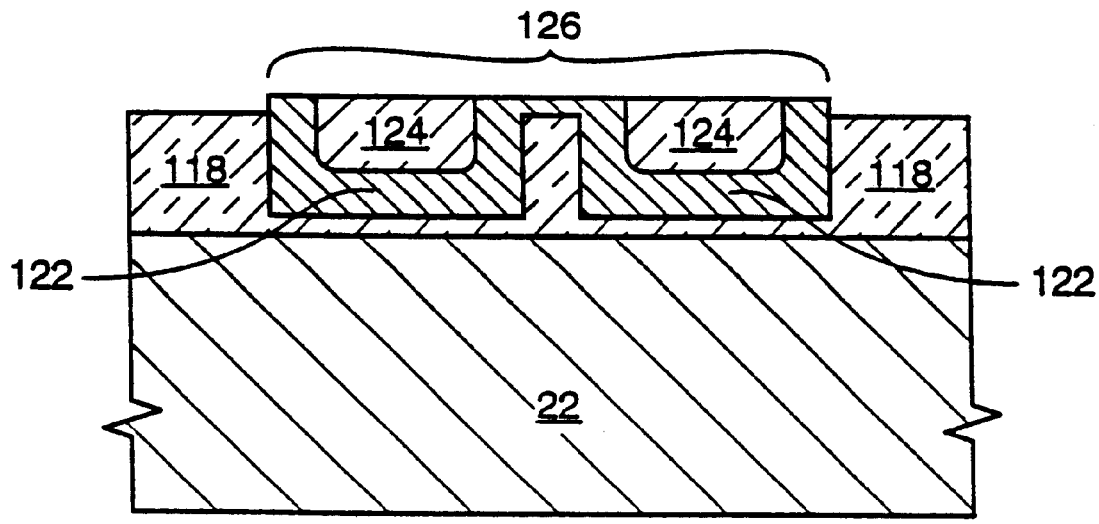
Figure 26G:
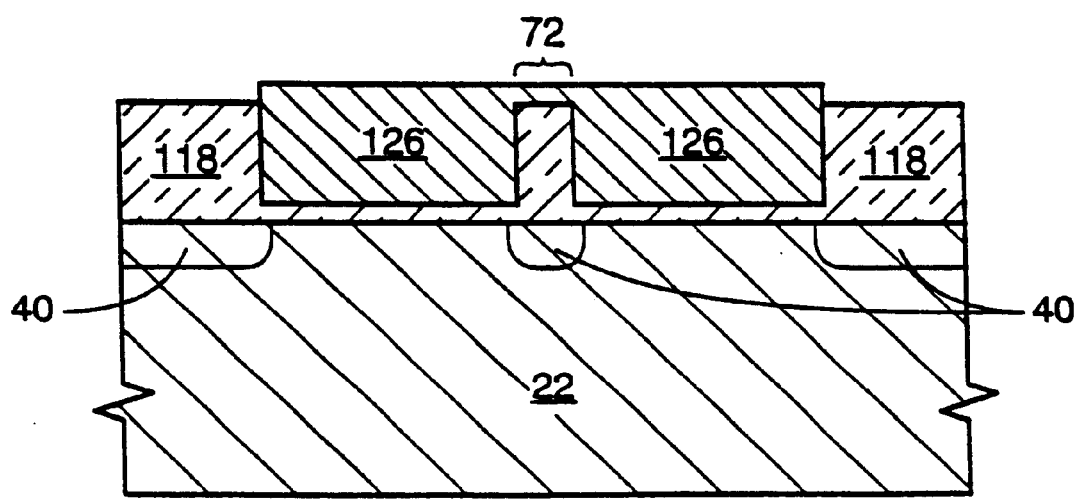

Moreover, as an alternative to etching a slot from a metal layer and filling the slot with a dielectric, it is also possible to etch a dielectric layer and fill the etched areas with metal in a manner similar to damascene processes used to create interconnects and other structures. Such an alternative is illustrated in FIGS. 26A through 26G. In FIG. 26A, a dielectric layer 118 is provided over the substrate 22. FIG. 26B shows that this layer is subsequently patterned and etched to define the plate site 120, as well as the slot 72. At least some insulation should remain over the substrate 22 to act as a dielectric. FIG. 26C shows that one or more layers of conductive material 122, 124, are then deposited. These layers 122, 124 can be planarized to a level even with the surface of the dielectric as depicted in FIG. 26D. Alternatively, conductive material may remain above the dielectric, as seen in FIG. 26E. Etching to define the perimeter of the conductive plate 126 can then be performed as desired. One result of such a step appears in FIG. 26F. Moreover, it may once again be desired to provide diffusion regions 40 under the slot 72 and around the perimeter of the conductive plate 126 at some point. FIG. 26G displays these regions 40. Such regions 40 may be provided in a non-self-aligned manner before depositing the dielectric layer 118.

Figure 27A:
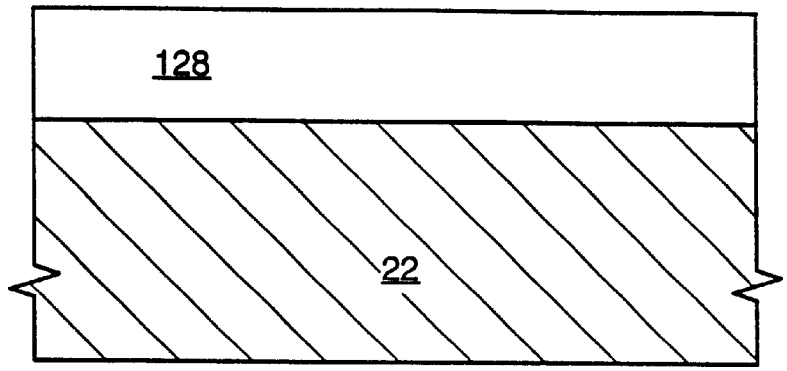
FIGS. 27A through 27G display other exemplary embodiments of the current invention.
Figure 27B:
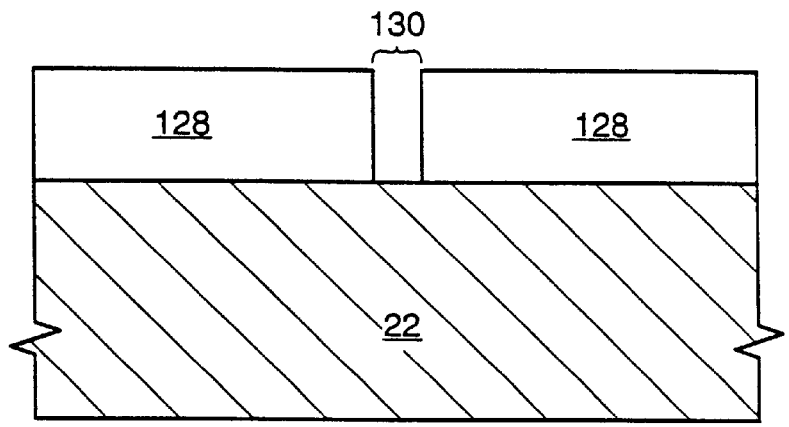
Figure 27C:
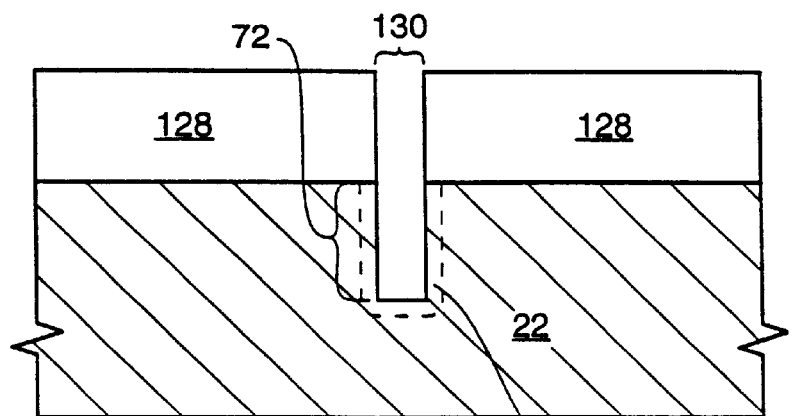
Figure 27D:
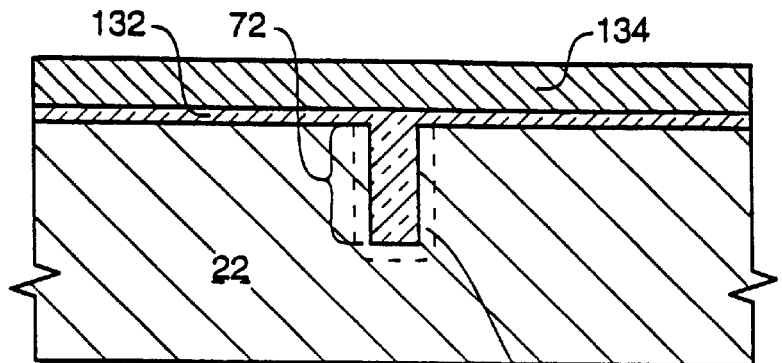
Figure 27E:
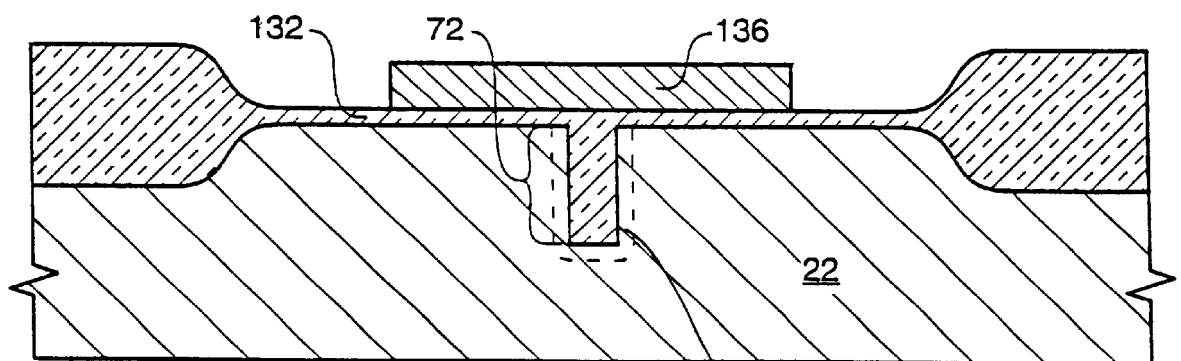
Figure 27F:
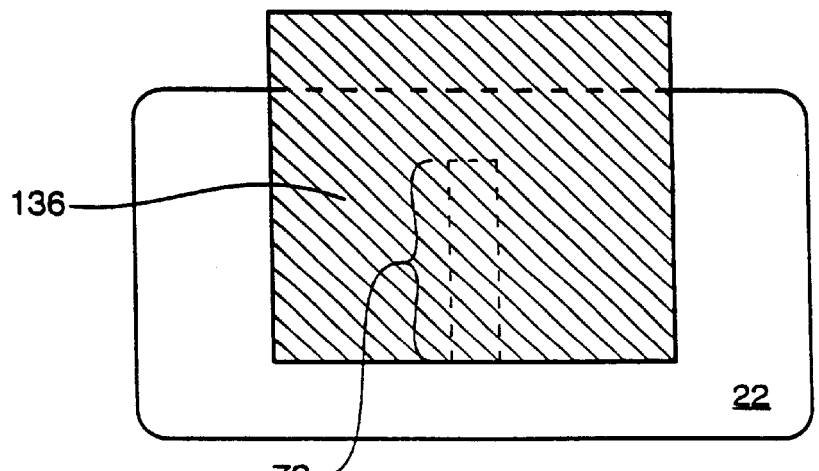
Figure 27G:
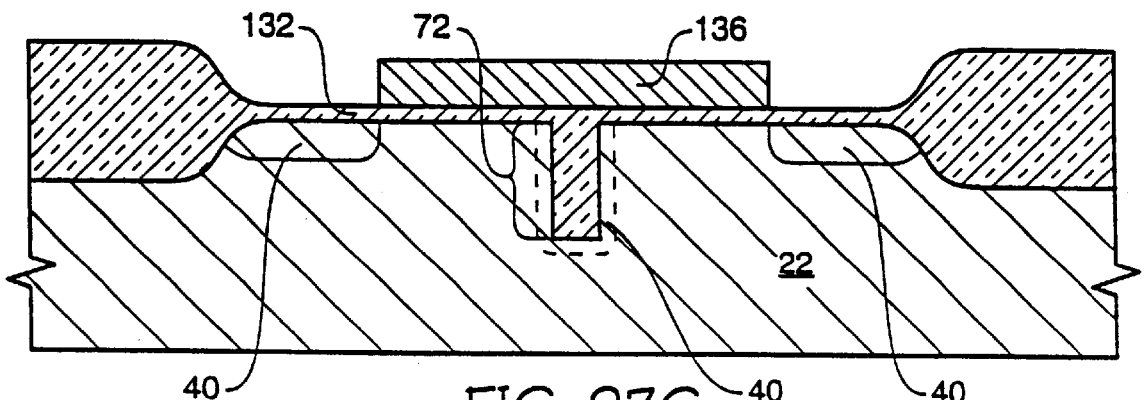

In addition, it is noteworthy that the previous embodiments have addressed providing a slot in the upper plate of a capacitor. The current invention, however, also includes within its scope providing a slot in the lower plate. FIGS. 27A through 27G illustrate a method for doing so assuming the bottom plate is a semiconductor substrate, although one skilled in the art will appreciate that the same procedures would apply to other conductive or semiconductive layers. In FIG. 27A, a mask layer 128 is deposited over the substrate 22. FIG. 27B indicates that this mask layer is patterned and etched to define a site 130 where the slot or notch will be etched from the substrate 22. Accordingly, as shown in FIG. 27C, an etch step creates at least one slot 72 within the substrate. Implantation steps known in the art, including angled implants, can be used to create a diffusion region 40 around the slot 72 (FIG. 27C). Once the mask layer 128 is removed, a dielectric layer 132 is grown or deposited, followed by the deposition of one or more conductive layers 134 (FIG. 27D). The conductive layer 134 is then patterned and etched to achieve a plate 136 of a desired shape; the result is illustrated in the cross-section of FIG. 27E and in the top-down view of FIG. 27F. Once again, diffusion regions 40, such as those illustrated in FIG. 27G, may be provided as desired.

Figure 28:
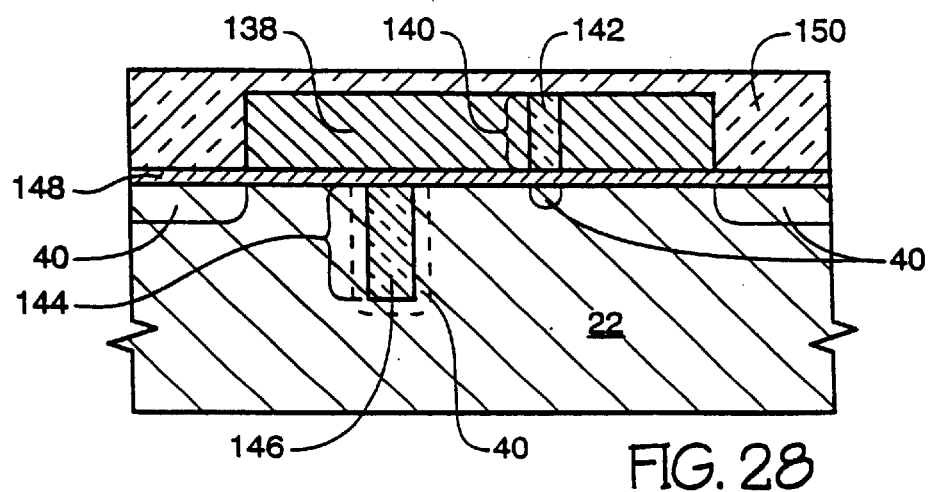
FIG. 28 represents yet another exemplary embodiment of the current invention.

It follows that the current invention also includes within its scope embodiments having slots in both the top plate and the bottom plate, so long as the fringe capacitance is sufficient to at least make up for the absence of conductive material. As depicted in FIG. 28, the conductive plate 138 has a first slot 140 filled with a dielectric material 142, while the substrate 22 has a second slot 144 also filled with a dielectric material 146. The substrate 22 also has diffusion regions 40 in areas corresponding to the first slot 140, the second slot 144, and the perimeter of the conductive plate 138. Yet another portion of dielectric material 148 separates the conductive plate 138 from the substrate 22. Insulation 150 also covers the device. Additional steps known in the art can be performed, including etching openings through the insulation 150 down to the diffusion regions 40 at the perimeter of the conductive plate 138. Conductive material could then fill those openings, thereby allowing electrical communication between the capacitor and other devices.

Further, the apparatus embodiments of the current invention may then be used in circuits such as those pictured in FIGS. 3 through 6 as well as any other circuit incorporating a charge storage device, including a memory cell. Accordingly, the invention is not limited except as stated in the claims.

What is claimed is:

1. A method of storing an electrical charge, comprising:

generating parallel capacitance within an area between two electrodes of a capacitor;

generating fringe capacitance within said area, wherein said step of generating fringe capacitance further comprises generating fringe capacitance between one of said two electrodes and a side of a hole within another of said two electrodes; and generating additional fringe capacitance in a second area external to said two electrodes.

2. A method of forming a charge storage device allotted a given capacitor plate area on a die, comprising:

forming a conductive material within said capacitor plate area having a gap within said conductive material;

configuring said gap to overcome an absence of parallel capacitance from said gap with fringe capacitance; and providing an insulative material for said gap.

3. The method in claim 2, wherein said step of forming a conductive material further comprises:

forming a conductive material within all of said capacitor plate area; and removing a portion of said conductive material.

4. A method of patterning a capacitor plate, comprising:

forming a layer of electrically conductive material within a capacitor plate site, wherein said layer of electrically conductive material is configured to generate a parallel capacitance per unit area; and forming a gap within said layer of electrically conductive material, wherein fringe capacitance related to said gap exceeds said parallel capacitance.

5. The method in claim 4, wherein said step of forming a gap further comprises defining a boundary of said gap with a portion of said layer of electrically conductive material, wherein fringe capacitance from said portion exceeds said parallel capacitance.

6. The method in claim 5, wherein said step of forming a gap further comprises oxidizing an area of said layer of electrically conductive material with a laser.

7. The method in claim 5, wherein:

said step of forming a layer of electrically conductive material within a capacitor plate site further comprises defining said capacitor plate site with a patterned mask layer;

said step of forming a gap further comprises defining said gap with said patterned mask layer; and wherein said method further comprises etching said layer of electrically conductive material as guided by said patterned mask layer.

8. The method in claim 5, wherein:

said step of forming a layer of electrically conductive material within a capacitor plate site further comprises defining said capacitor plate site with a patterned mask layer;

said step of forming a gap further comprises defining said gap with said patterned mask layer and with a spacer around said patterned mask layer; and wherein said method further comprises etching said layer of electrically conductive material as guided by said patterned mask layer and said spacer.

9. A method of forming a capacitor, comprising:

providing a semiconductor substrate;

forming an oxide over said substrate;

forming a conductive layer over said oxide, wherein said step of forming a conductive layer further comprises forming a first component layer over said substrate;

forming a pattern over said conductive layer;

defining a plate site having a gap with said pattern;

etching a portion of said conductive layer uncovered by said pattern, wherein said step of etching further comprises etching said first component layer;

removing said pattern from an unetched portion of said first component layer;

filling said gap with an insulative material;

forming a second component layer over said unetched portion of said first component layer and over said gap;

forming a second pattern over said second component layer;

covering said plate site with said second pattern; and etching a portion of said second component layer uncovered by said second pattern.

10. The method in claim 9, further comprising doping said substrate after said step of etching said first component layer and before said step of filling said gap with an insulative material.

11. A method of forming a top plate of a capacitor further comprising a substrate and an oxide overlying said substrate, comprising:

forming a fist plate layer over said oxide;

forming a hole within said first plate layer;

forming a second plate layer over said first plate layer;

defining said top plate from said first plate layer; and further defining said top plate from said second plate layer.

12. The method in claim 11 wherein said method further comprises forming a second hole within said second plate layer; and wherein said steps of forming a hole within said first plate layer, forming a second hole within said second plate layer, defining said top plate from said first plate layer, and further defining said top plate from said second plate layer, result from a common etch.

13. The method in claim 11, wherein said step of forming a hole within said first plate layer comprises etching said hole into said first plate layer; and said step of further defining said top plate from said second plate layer comprises separately etching said second plate layer.

14. The method in claim 13, wherein said step of forming a hole within said first plate layer is discrete from said step of defining said top plate from said first plate layer.

15. The method in claim 14, wherein said steps of defining said top plate from said first plate layer and said step of further defining said top plate from said second plate layer result from a common etch.

16. The method in claim 13, wherein:
said step of defining said top plate from said first plate layer further comprises etching said first plate layer; and
said step of further defining said top plate from said second plate layer comprises separately etching said second plate layer.

17. The method in claim 16, wherein said step of forming a hole within said first plate layer and said step of defining said top plate from said first plate layer result from a common etch.

18. A method of forming a capacitor on a semiconductor substrate, comprising:
forming an oxide over said semiconductor substrate;
forming a first plate layer over said oxide;
forming a first hole within said first plate layer;
forming a second plate layer over said fist plate layer;
defining an outer plate perimeter from said first plate layer and said second plate layer, wherein said outer plate perimeter at least partially encompasses said first hole;
doping said substrate in a first area corresponding to said first hole; and
doping said substrate in a second area extending from said outer plate perimeter.

19. The method in claim 18, further comprising:
forming a second hole in said second plate layer, wherein said second hole corresponds to said first hole;
and wherein said steps of
doping said substrate in a first area, and
doping said substrate in a second area result from a common implantation step.

20. The method in claim 18, wherein said steps of
doping said substrate in a first area, and
doping said substrate in a second area result from discrete implantation steps.

21. A method of forming a plate of a capacitor further comprising an insulative layer over a substrate, comprising:
form a first plate layer;
etching a hole into said first plate layer;
forming a second plate layer;
etching a plate perimeter from said first plate layer and said second plate layer;
doping said substrate under said hole; and
doping said substrate external to said plate perimeter.

22. The method in claim 21, wherein:
said step of doping said substrate under said hole and said step of doping said substrate external to said plate perimeter are discrete doping steps; and
said step of etching a plate perimeter and said step of etching a hole result from a common etching.

23. The method in claim 21, wherein
said step of etching a plate perimeter and said step of etching a hole are discrete etching steps; and
said step of doping said substrate under said hole and said step of doping said substrate external to said plate perimeter result from a common implantation.

24. A method of forming an electrode for a capacitor, comprising:
layering a first conductive material for said electrode over a support surface, wherein said step of layering a first conductive material further comprises layering said first conductive material over a substrate;
creating a recess within said first conductive material;
layering a second conductive material for said electrode over said first conductive material;
layering a capacitor dielectric material over said first conductive material; and
forming a spacer within said recess, wherein said step of forming a spacer further comprises anisotropically etching said capacitor dielectric material, and wherein said step of layering a second conductive material further comprises layering said second conductive material over said spacer; and
doping said substrate after said step of creating a recess.

25. A method of constructing a capacitor, comprising:
providing a first capacitor plate, wherein said step of providing a first capacitor plate further comprises providing a substrate;
making a first hole in said first capacitor plate;
filling said first hole with a first portion of insulating material;
providing a second capacitor plate next to said first capacitor plate;
providing a dielectric material between said first capacitor plate and said second capacitor plate;
making a second hole in said second capacitor plate; and
filling said second hole with a second portion of insulating material.

26. The method in claim 25, wherein said step of making a second hole further comprises making a second hole over a whole portion of said substrate.

27. The method in claim 26, wherein said step of making a second hole further comprises making a second hole over a non-gap portion of said substrate.

* * * * *

UNITED STATES PATENT AND TRADEMARK OFFICE
CERTIFICATE OF CORRECTION

PATENT NO.     : 6,316,326 B1
DATED          : November 13, 2001
INVENTOR(S)    : Kao et al.

It is certified that error appears in the above-identified patent and that said Letters Patent is hereby corrected as shown below:

Title page,
Item [57], ABSTRACT, delete "semicondutor" and replace it with -- semiconductor --.

Column 1,
Line 43, delete "commnonly" and replace it with -- commonly --.

Column 2,
Line 31, delete "is".

Column 4,
Line 19, delete "s" after the term "demonstrates";
Line 57, delete both instances of the term "silicide" and replace them with -- silicided --.

Column 5,
Line 54, delete the comma ",".

Column 6,
Line 54, delete "two dimensional" and replace it with -- two-dimensional --.

Column 7,
Line 59, delete "pacing" and replace it with -- spacing --.

Column 14,
Line 7, delete "do".

UNITED STATES PATENT AND TRADEMARK OFFICE
CERTIFICATE OF CORRECTION

PATENT NO. : 6,316,326 B1
DATED : November 13, 2001
INVENTOR(S) : Kao et al.

It is certified that error appears in the above-identified patent and that said Letters Patent is hereby corrected as shown below:

<u>Column 18,</u>
Line 38, delete "fist" and replace it with -- first --.

<u>Column 19,</u>
Line 39, delete "form" and replace it with -- forming --.

Signed and Sealed this

Twenty-eighth Day of January, 2003

JAMES E. ROGAN
*Director of the United States Patent and Trademark Office*